US009772554B2

(12) United States Patent
Hustad et al.

(10) Patent No.: US 9,772,554 B2
(45) Date of Patent: Sep. 26, 2017

(54) COPOLYMER FORMULATION FOR DIRECTED SELF-ASSEMBLY, METHODS OF MANUFACTURE THEREOF AND ARTICLES COMPRISING THE SAME

(71) Applicants: Dow Global Technologies LLC, Midland, MI (US); Rohm and Haas Electronic Materials LLC, Malborough, MA (US); THE REGENTS OF THE UNIVERSITY OF CALIFORNIA, Oakland, CA (US)

(72) Inventors: Phillip D. Hustad, Watertown, MA (US); Peter Trefonas, III, Medway, MA (US); Valeriy V. Ginzburg, Midland, MI (US); Bongkeun Kim, Goleta, CA (US); Glenn H. Fredrickson, Santa Barbara, CA (US)

(73) Assignees: DOW GLOBAL TECHNOLOGIES LLC, Midland, MI (US); ROHM AND HAAS ELECTRONIC MATERIALS LLC, Marlborough, MA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/052,922

(22) Filed: Feb. 25, 2016

(65) Prior Publication Data
US 2016/0254141 A1    Sep. 1, 2016

Related U.S. Application Data

(60) Provisional application No. 62/121,253, filed on Feb. 26, 2015.

(51) Int. Cl.
*G03F 7/004*    (2006.01)
*G03F 7/40*    (2006.01)
(Continued)

(52) U.S. Cl.
CPC .............. *G03F 7/165* (2013.01); *B82Y 10/00* (2013.01); *B82Y 40/00* (2013.01);
(Continued)

(58) Field of Classification Search
CPC .... G03F 7/0002; G03F 7/0035; G03F 7/2059; G03F 7/40; G03F 7/165; G03F 7/2022;
(Continued)

(56) References Cited

U.S. PATENT DOCUMENTS 7,521,090 B1    4/2009    Cheng
8,059,350 B2    11/2011    Albrecht et al.
(Continued)

FOREIGN PATENT DOCUMENTS

JP    2005041931 A    2/2005
TW    I460530 B    11/2014
WO    2013011314 A1    1/2013

OTHER PUBLICATIONS

Mitra et al, "Thin Film Phase Behavior of Bottlebrush/Linear Polymer Blends", Macromolecules 47, pp. 5269-5276 (2014).*
(Continued)

*Primary Examiner* — Amanda C Walke
(74) *Attorney, Agent, or Firm* — Cantor Colburn LLP

(57) ABSTRACT

Disclosed herein is a pattern forming method comprising providing a substrate devoid of a layer of a brush polymer; disposing upon the substrate a composition comprising a block copolymer comprising a first polymer and a second polymer; where the first polymer and the second polymer of the block copolymer are different from each other; and an additive polymer where the additive polymer comprises a bottlebrush polymer; where the bottlebrush polymer comprises a polymeric chain backbone and a grafted polymer that are bonded to each other; and where the bottlebrush polymer comprises a polymer that is chemically and struc-
(Continued)

turally the same as one of the polymers in the block copolymer or where the bottlebrush polymer comprises a polymer that has a preferential interaction with one of the blocks of the block copolymers; and a solvent; and annealing the composition to facilitate domain separation between the first polymer and the second polymer.

7 Claims, 13 Drawing Sheets

(51) Int. Cl.

| | |
|---|---|
| G03F 7/16 | (2006.01) |
| H01L 21/027 | (2006.01) |
| C09D 153/00 | (2006.01) |
| C09D 5/00 | (2006.01) |
| C09D 7/12 | (2006.01) |
| G03F 7/20 | (2006.01) |
| G03F 7/00 | (2006.01) |
| H01L 21/3065 | (2006.01) |
| H01L 21/02 | (2006.01) |
| B82Y 40/00 | (2011.01) |
| B82Y 10/00 | (2011.01) |
| C08F 293/00 | (2006.01) |
| C08F 299/00 | (2006.01) |
| C08L 53/00 | (2006.01) |

(52) U.S. Cl.
CPC ........ *C08F 293/005* (2013.01); *C08F 299/00* (2013.01); *C08L 53/00* (2013.01); *C09D 5/00* (2013.01); *C09D 7/125* (2013.01); *C09D 153/00* (2013.01); *G03F 7/0002* (2013.01); *G03F 7/0035* (2013.01); *G03F 7/2022* (2013.01); *G03F 7/2059* (2013.01); *G03F 7/40* (2013.01); *H01L 21/0271* (2013.01); *H01L 21/0274* (2013.01); *H01L 21/02112* (2013.01); *H01L 21/3065* (2013.01); *C08F 2438/01* (2013.01)

(58) Field of Classification Search
CPC ........... H01L 21/0274; H01L 21/02112; H01L 21/3065; H01L 21/0392; B82Y 10/00; B82Y 40/00; C08L 53/00
USPC ....... 430/313, 314, 317, 322, 325, 329, 330, 430/331, 296, 323; 438/700, 689, 711, 438/699, 781; 216/47, 57
See application file for complete search history.

(56) References Cited

U.S. PATENT DOCUMENTS

| | | | |
|---|---|---|---|
| 8,101,261 B2 | 1/2012 | Millward et al. | |
| 8,343,578 B2 | 1/2013 | Kim et al. | |
| 8,716,151 B2 | 5/2014 | Zhang et al. | |
| 8,821,738 B2 | 9/2014 | Hustad | |
| 8,822,615 B1 | 9/2014 | Trefonas | |
| 8,834,956 B2* | 9/2014 | Sills | B81C 1/00031 427/271 |
| 2005/0112886 A1 | 5/2005 | Asakawa et al. | |
| 2006/0134556 A1* | 6/2006 | Nealey | B81C 1/00031 430/311 |
| 2007/0175859 A1* | 8/2007 | Black | B81C 1/00031 216/41 |
| 2009/0087653 A1 | 4/2009 | Nealey et al. | |
| 2009/0181171 A1* | 7/2009 | Cheng | B05D 5/02 427/256 |
| 2009/0260750 A1 | 10/2009 | Nealey | |
| 2011/0147983 A1* | 6/2011 | Cheng | B81C 1/00031 264/220 |
| 2012/0135159 A1 | 5/2012 | Xiao et al. | |
| 2012/0202017 A1 | 8/2012 | Nealey et al. | |
| 2013/0189504 A1* | 7/2013 | Nealey | B82Y 30/00 428/201 |
| 2013/0209694 A1 | 8/2013 | Chang et al. | |
| 2013/0209696 A1 | 8/2013 | Sharma et al. | |
| 2013/0209755 A1 | 8/2013 | Hustad et al. | |
| 2014/0141375 A1 | 5/2014 | Cho | |
| 2014/0142249 A1 | 5/2014 | Cho | |
| 2014/0142252 A1 | 5/2014 | Cho | |
| 2014/0287266 A1 | 9/2014 | Watanabe et al. | |
| 2014/0349486 A1* | 11/2014 | Sills | B81C 1/00031 438/700 |
| 2014/0377518 A1 | 12/2014 | Trefonas, III et al. | |
| 2014/0378592 A1 | 12/2014 | Trefonas, III et al. | |
| 2015/0184024 A1* | 7/2015 | Chang | C09D 183/10 428/447 |
| 2015/0240110 A1 | 8/2015 | Willson et al. | |
| 2016/0024246 A1* | 1/2016 | Mahanthappa | C08G 63/08 528/354 |
| 2016/0186001 A1 | 6/2016 | Hustad et al. | |
| 2016/0186002 A1 | 6/2016 | Hustad et al. | |
| 2016/0186003 A1 | 6/2016 | Hustad et al. | |
| 2016/0186004 A1 | 6/2016 | Hustad et al. | |
| 2016/0251508 A1 | 9/2016 | Hustad et al. | |
| 2016/0251538 A1 | 9/2016 | Hustad et al. | |
| 2016/0251539 A1 | 9/2016 | Hustad et al. | |

OTHER PUBLICATIONS

Verduzco et al, "Structure, function, self-assembly, and applications of bottlebrush copolymers", Chem. Soc. Rev. 44, pp. 2405-2420 (2015).*
Bosse, et al. "Microdomain Ordering in Laterally Confined Block Copolymer Thin Films", Macromolecules 40, 9570 (2007).
Grimaud, et al. "Controlled/"Living" Radical Polymerization of Methyl Methacrylate by Atom Transfer Radical Polymerization" in Macromolecules 1997, 30, 2216-2218.
Gu, et al. "Self-Assembly of Symmetric brush Diblock Copolymers", ACS Nano, 7(3), 2551, 2013.
Gurr, et al. "Polyimide polydimethylsiloxane triblock copolymers for thin film composite gas separation membranes" J Polym Sci Pol Chem 2014, 52, 3372-3382.
Han, et al., "Effect of Composition of Substrate-Modifying Random Copolymers on the Orientation of Symmetric and Asymmetric Diblock Copolymer Domains," Macromolecules, 2008, 41 (23), pp. 9090-9097.
Hong, et al. "On the Self-Assembly of Brush Block Copolymers in Thin Films", ACS Nano, 7(11), 9684, 2013.
Iwama, et al. "Computational Studies of Shape Rectification in Directed Self-Assembly", Proc. SPIE, 9049, 904927 (2014).
Iwama, et al. "The Hole Shrink Problem: Directed Self-Assembly Using Self-Consistent Field Theory", J. Photopolymer Science & Technology 26, 15-20 (2013).
Ji, et al. "Molecular Transfer Printing Using Block Copolymers" ACS Nano, 2010, 4 (2), pp. 599-609.
Ji, et al. "Preparation of neutral wetting brushes for block copolymer films from homopolymer blends", Advanced Materials, 2008, 20, 3054-3060.
Kim, B. "Defectivity Study of Directed Self-Assembly of Cylindrical Diblock Copolymers in Laterally Confined Thin Channels", Proc. of SPIE, 8680, 868016 (2013).
Kim, B. et al. "Thermodynamic and Kinetic Aspects of Defectivity in Directed Self-Assembly of Cylinder-Forming Diblock Copolymers in Laterally Confining Thin Channels", J. Appl. Polym. Sci., 131, 40790 (2014).
Laachi et al. "Field-Theoretic Simulations of Directed Self-Assembly in Cylindrical Confinement: Placement and Rectification Aspects", Proc. SPIE, 9049, 90491M (2014).
Laachi, et al. "Directed Self-Assembly of Diblock Copolymers in Laterally Confining Channels: Effect of Rough Surfaces on Line-Edge Roughness (LER) and Defectivity", Proc. SPIE, 9049, 90491D (2014).

(56) References Cited

OTHER PUBLICATIONS

Laachi, et al. "Self-Consistent Field Theory Investigation of Directed Self-Assembly in Cylindrical Confinement", J. Polym. Sci. B Polym. Phys . . . doi: 10.1002/polb.23452.

Laachi, et al. "The Hole Shrink Problem: Theoretical Studies of Directed Self-Assembly in Cylindrical Confinement", Proc. of SPIE 8680, 868014 (2013).

Le, D., et al. "Synthesis of Well-Defined ω-Oxanorbornenyl Poly(ethylene oxide) Macromonomers via Click Chemistry and Their Ring-Opening Metathesis Polymerization" Macromolecules 2010, 43, 5611-5617.

Liu, et al. "Fabrication of Lithographically Defined Chemically Patterned Polymer Brushes and Mats" Macromolecules, 2011, 44 (7), pp. 1876-1885.

Macfarlane, et al. "Improving Brush Polymer Infrared 1-D Photonic Crystals via Linear Polymer Additives", J. Am. Chem. Soc., 2014, 136 (50), pp. 17374-17377.

Mansky, et al "Controlling Polymer-Surface Interactions with Random Copolymer Brushes" Science 1997, 275 (5305), 1458-1460.

Mansky, et al. "Ordered Diblock Copolymer Films on Random Copolymer Brushes" Macromolecules 1997, 30 (22), 6810-6813.

Takahashi, et al. "Defectivity in Laterally Confined Lamella-Forming Diblock Copolymers: Thermodynamic and Kinetic Aspects", Macromolecules 45, 6253-6265 (2012).

Trefonas, et al. "Bottom-up/top-down, high-resolution, high-throughput lithography using vertically assembled block bottle brush polymers" J. Micro/Nanolith. MEMS MOEMS. 12(4), 043006 (Dec. 16, 2013).

Edwards et al.; "Precise Control over Molecular Dimensions of Block-Copolymer Domains Using the Interfacial Energy of Chemically Nanopatterned Substrates"; Adv. Mater.; 16, No. 15; Aug. 4, 2004, 1315-1319.

Kim et al.; "Epitaxial self-assembly of block copolymers on lithographically defined nanopatterned substrates"; Nature; vol. 424; Jul. 24, 2003, p. 411-414.

Ruiz et al.; "Density Multiplication and Improved Lithography by Directed Block Copolymer Assembly"; Science; vol. 321; Aug. 15, 2008, pp. 936-939.

\* cited by examiner

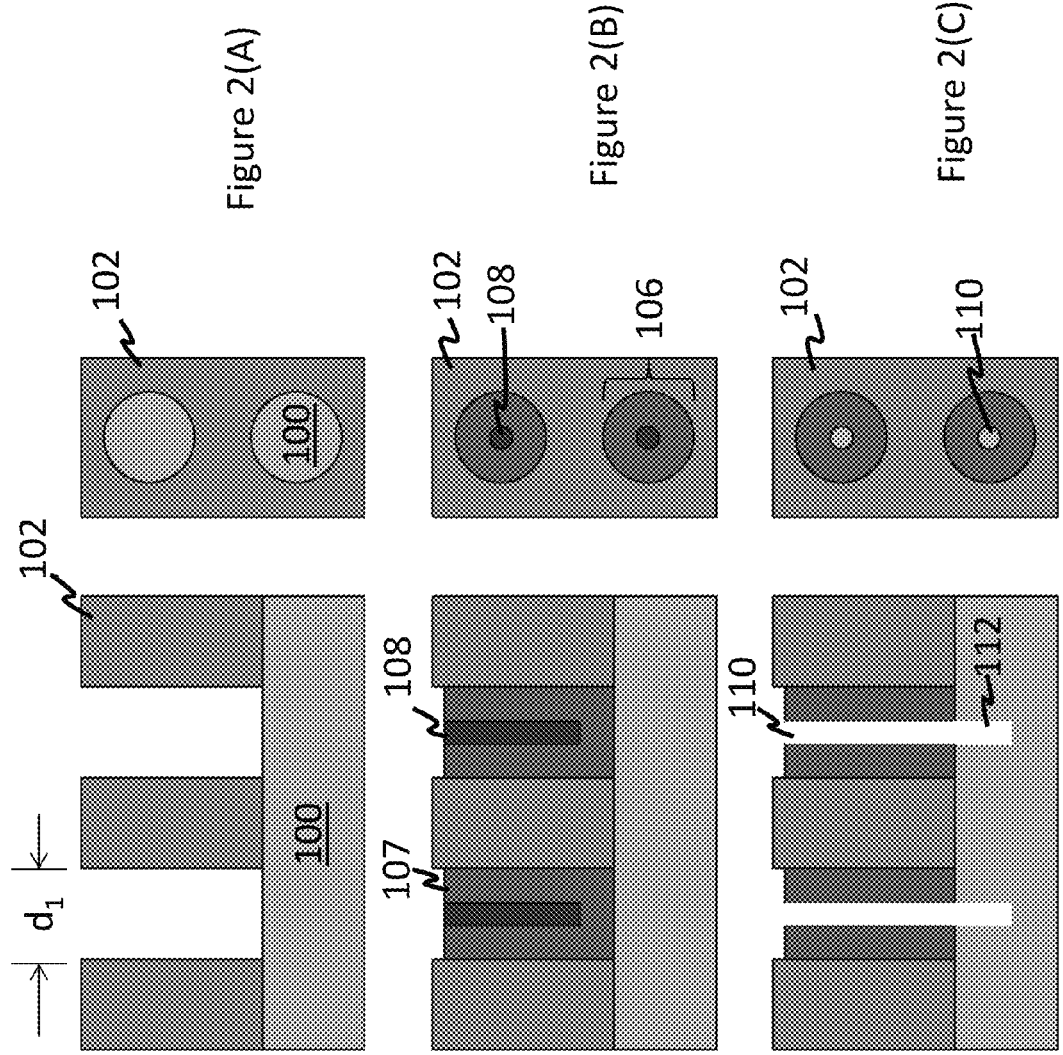

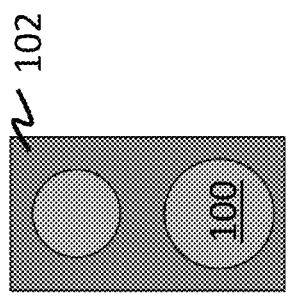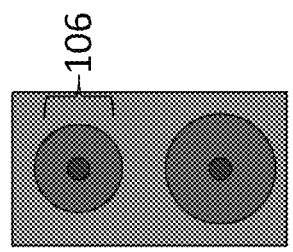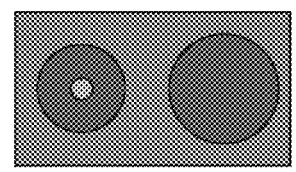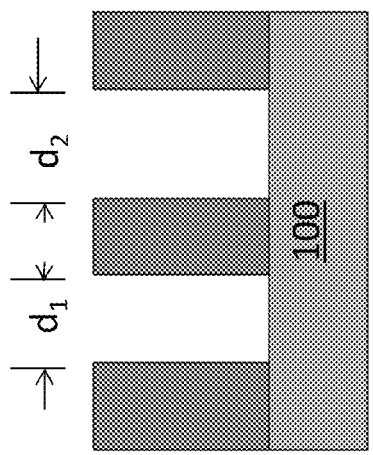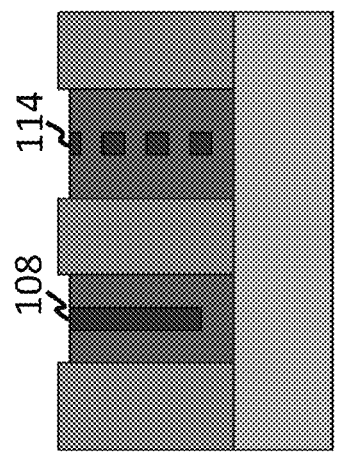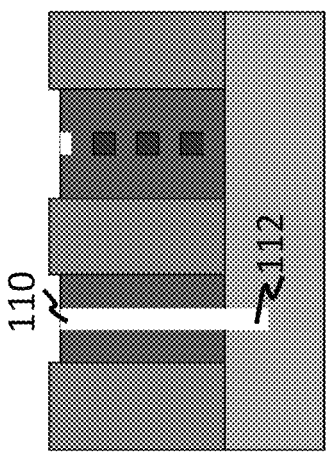
Figure 2(D)    Figure 2(E)    Figure 2(F)

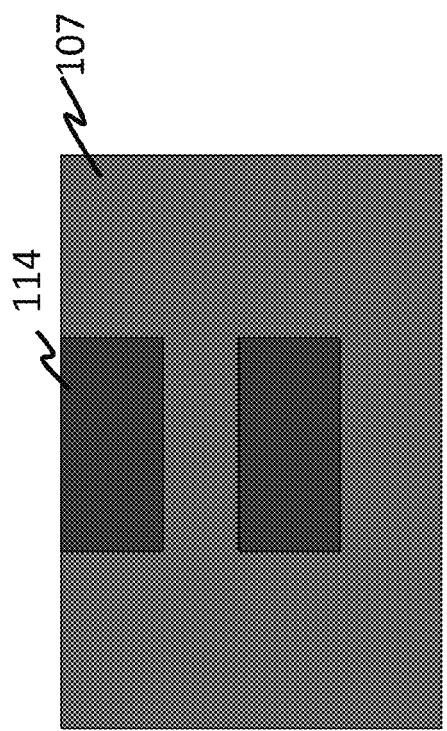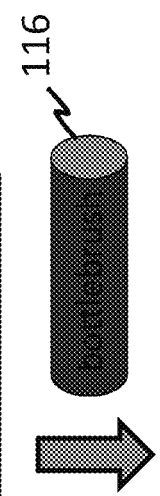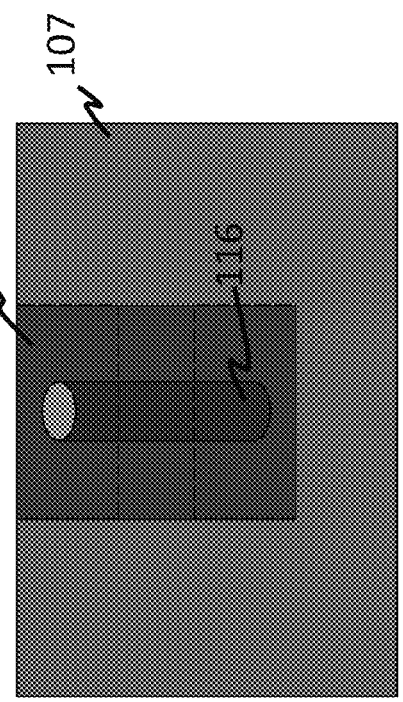

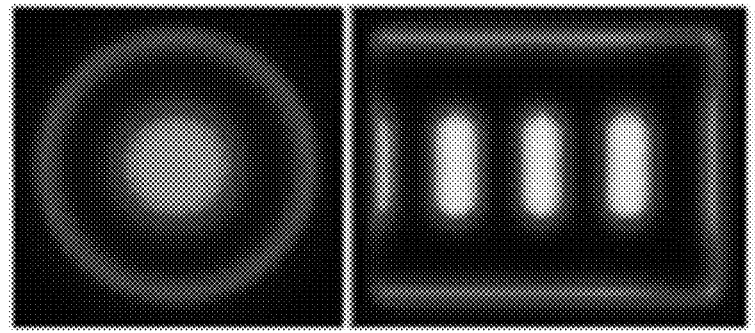
Figure 4(B) four bead defect
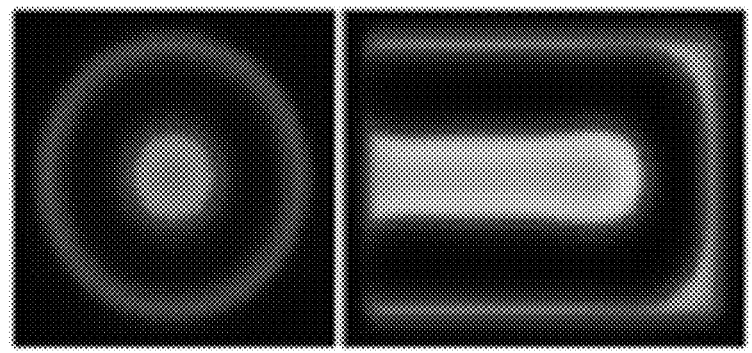
Figure 4(A) Ideal morphology

| Formulation | Comparative Example E | Comparative Example F | Comparative Example G |
|---|---|---|---|
| PDMS (vol%) | 26.2 | 29.0 | 30.9 |
| SEM micrograph | 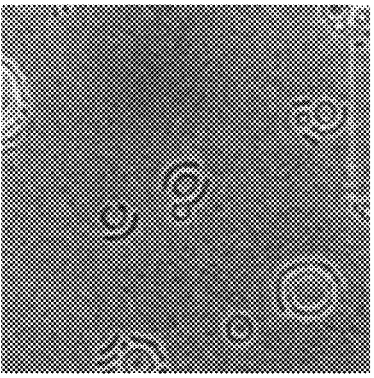 | 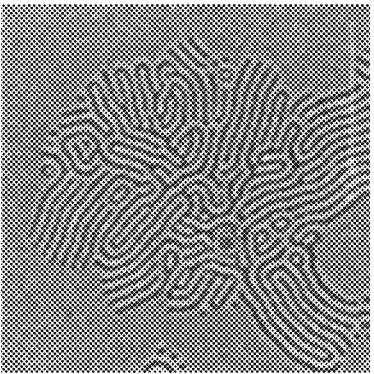 | 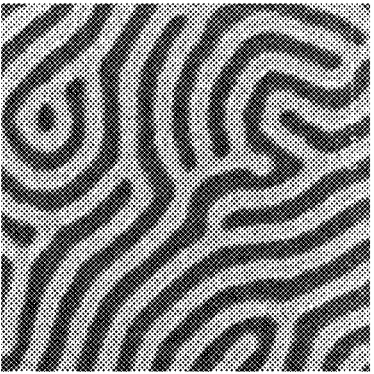 |
Figure 11

COPOLYMER FORMULATION FOR DIRECTED SELF-ASSEMBLY, METHODS OF MANUFACTURE THEREOF AND ARTICLES COMPRISING THE SAME

CROSS REFERENCE TO RELATED APPLICATION

This US Non-Provisional application claims the benefit of U.S. Provisional Application Ser. No. 62/121,253, filed 26 Feb. 2015, the entire contents of which are hereby incorporated by reference.

BACKGROUND

This disclosure relates to a copolymer formulation for directed self-assembly, methods of manufacture thereof and to articles comprising the same.

Directed self-assembly (DSA) of block copolymers has been identified as a candidate technology to extend the state of current optical lithography. In DSA, small pitch sizes are achieved by directing the self-assembled block copolymer nanodomains to a lithographically patterned substrate. One of the leading methods for DSA involves a chemical pattern to align a lamellar morphology of a block copolymer, such as polystyrene-block-poly(methyl methacrylate), or PS-b-PMMA. The preferred process scheme, shown in FIG. 1, begins by patterning an array of sparse guide stripes (e.g., polystyrene (PS) generally manufactured from a crosslinked polystyrene mat. After the stripes are etched (also termed "etch trimming") to the proper dimension, the brush polymer is coated over the stripes, baked to induce chemical grafting, and then excess brush polymer is removed by rinsing with a solvent such as propylene glycol methyl ether acetate (PGMEA) to leave a relatively flat substrate with chemical contrast. The substrate is then treated with a block copolymer (e.g. poly(styrene-b-methylmethacrylate)), which after annealing aligns to the substrate to multiply the density of the initial pattern. In this two-step method that involves first applying the brush followed by applying the block copolymer (BCP), the composition of the brush has to be controlled over a fairly tight range in order to achieve good DSA results.

It is therefore desirable to use compositions where the alignment between domains can be easily achieved and where the ranges of the polymers are not so tightly controlled.

SUMMARY

Disclosed herein is a pattern forming method comprising providing a substrate devoid of a layer of a brush polymer; disposing upon the substrate a composition comprising a block copolymer comprising a first polymer and a second polymer; where the first polymer and the second polymer of the block copolymer are different from each other; and an additive polymer where the additive polymer comprises a bottlebrush polymer; where the bottlebrush polymer comprises a polymeric chain backbone and a grafted polymer that are bonded to each other; and where the bottlebrush polymer comprises a polymer that is chemically and structurally the same as one of the polymers in the block copolymer or where the bottlebrush polymer comprises a polymer that has a preferential interaction with one of the blocks of the block copolymers; and a solvent; and annealing the composition to facilitate domain separation between the first polymer and the second polymer of the block copolymer to form a morphology of periodic domains formed from the first polymer and the second polymer; where a longitudinal axis of the periodic domains are perpendicular to the substrate.

BRIEF DESCRIPTION OF THE FIGURES

FIG. 2(A) depicts a substrate with a photoresist having holes of diameter $d_1$ disposed thereon;

FIG. 2(B) depicts the substrate of the FIG. 2(A) with a block copolymer disposed in the holes;

FIG. 2(C) shows the substrate after etching to remove the cylindrical core;

FIG. 2(D) depicts a substrate with a photoresist having holes of diameter $d_1$ and holes of diameter $d_2$ disposed thereon, where $d_2$ is greater than $d_1$;

FIG. 2(E) shows that a continuous cylindrical core in formed in the narrow diameter hole while discontinuous cylinders (discs) are formed in the broader diameter hole;

FIG. 2(F) shows that a continuous cylindrical core can be removed via etching from the narrow diameter hole while only one of the discs can be etched from the broader diameter hole;

FIG. 3(A) is an enlarged depiction of the discontinuous discs present in the hole having the broader diameter. This is considered a defect;

FIG. 3(B) shows how the defective discontinuous discs can be prevented from forming by using a composition that comprises bottlebrush polymers;

FIGS. 4(A) and 4(B) depict ideal and defect morphologies arising from the self-assembly of a linear PS-b-PMMA block copolymer in a cylindrical pre-pattern with PS-block-attractive walls, including top-down and cross-section views. PMMA density profiles are shown in light colors;

FIG. 11 is a photomicrograph that depicts the morphology for the Comparative Examples D, E and F.

DETAILED DESCRIPTION

Figure 1:
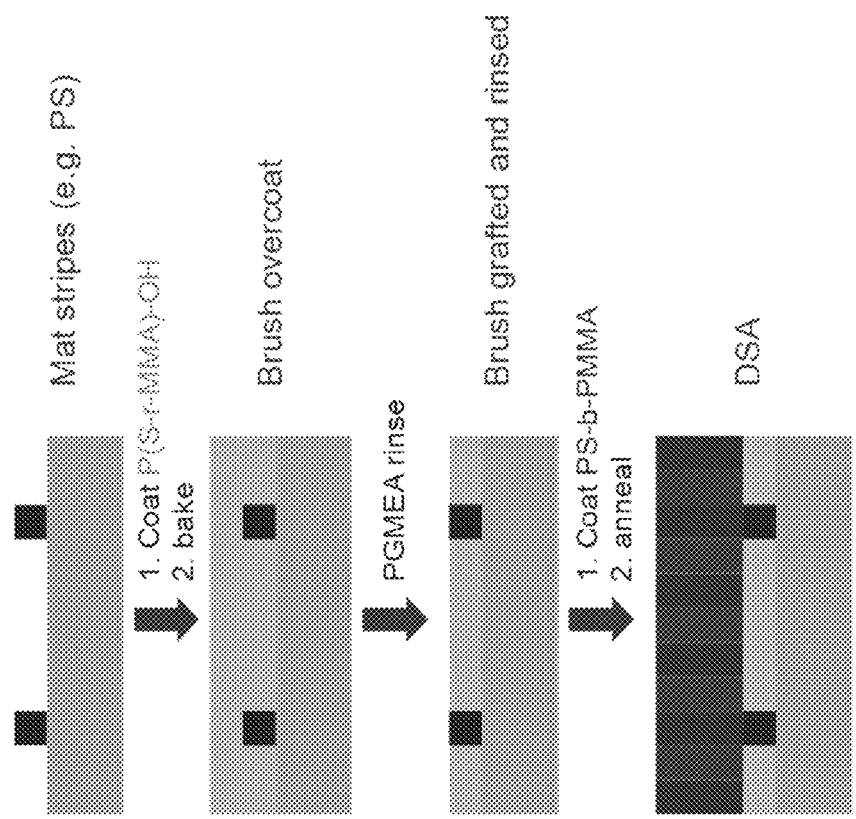
FIG. 1 is a schematic depiction of a prior art method that involves domain alignment by first applying the brush followed by applying the block copolymer.

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 400° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first polymer derived from polymerization of a first monomer and a second polymer derived from polymerization of a second monomer that forms domains through phase separation. "Domain", as used herein, means a compact crystalline, semi-crystalline, or amorphous region formed by corresponding blocks of the block copolymer, where these regions may be lamellar, cylindrical, or spherical and are formed orthogonal or perpendicular to the plane of the surface of the substrate. Perpendicularly oriented lamellae provide nanoscale line patterns, while there is no nanoscale surface pattern created by parallel oriented lamellae. Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns, whereas cylinders that form perpendicular to the surface form nanoscale hole patterns. Therefore, to form a useful pattern, control of the orientation of the self-assembled microdomains in the block copolymer is desirable. In an embodiment, the domains may have an average largest dimension of about 1 to about 25 nanometers (nm), specifically about 5 to about 22 nm, and still more specifically about 7 to about 20 nm.

The term "$M_n$" used herein and in the appended claims in reference to a block copolymer of the present invention is the number average molecular weight of the block copolymer (in g/mol) determined according to the method used herein in the Examples.

The term "$M_w$" used herein and in the appended claims in reference to a block copolymer of the present invention is the weight average molecular weight of the block copolymer (in g/mol) determined according to the method used herein in the Examples.

The term "PDI" or " Đ " used herein and in the appended claims in reference to a block copolymer of the present invention is the polydispersity (also called polydispersity index or simply "dispersity") of the block copolymer determined according to the following equation:

$$PDI=M_w/M_n.$$

The transition term "comprising" is inclusive of the transition terms "consisting of" and "consisting essentially of".

The term "and/or" is used herein to mean both "and" as well as "or". For example, "A and/or B" is construed to mean A, B or A and B.

The terms "brush" or "brush polymer" as used herein to describe a polymer containing a reactive functional group that is capable of reacting with a functional group upon the surface of the substrate to form a layer of polymer chains attached to the substrate. The terms "mat" or "mat-like film" are used to describe a polymeric layer on a substrate formed by disposing a polymer having reactive substituents along the chain backbone capable of reacting either with itself or a crosslink-inducing additive to form bonds or crosslinks between individual chains of the polymer after it is disposed upon the substrate. A brush polymer is one where the chain backbone is oriented perpendicular to the substrate while a mat polymer is one where the chain backbone is oriented parallel to the substrate. Brush polymers generally have a reactive functionality that permit it to be bonded with the substrate.

A bottlebrush polymer comprises a polymeric chain backbone and has polymeric arms extending radially from the chain backbone. In other words, the bottlebrush polymer comprises a polymeric chain backbone with graft polymers (the polymeric arms) that are bonded (either covalently, ionically or via hydrogen bonding) with the chain backbone. The graft polymer (i.e., the arms) may comprise polar polymers, non-polar polymers, or combinations thereof. For example, a portion of the chain backbone may have polar polymers grafted onto it, while another portion of the chain backbone may have non-polar polymers grafted onto it. The polar polymers and the non-polar polymers may be sequentially arranged in sections vertically along the chain backbone. In another embodiment, the polar and non-polar polymers may be opposedly arranged on the chain backbone i.e. they extend out radially in different directions but are interspersed with each other. In other words, the polar graft polymer extends in a first direction and may be bonded with the polymer chain backbone between two non-polar graft polymers that are also bonded with the polymer chain backbone but extend in a second direction. The bottle brush polymer does not contain any reactive functionalities that permit it to reactively bond with the substrate. Bottle brush polymers are not covalently, ionically or hydrogen bonded with the substrate.

Disclosed herein is a composition (also referred to herein sometimes as a solution) comprising a block copolymer and an additive polymer that facilitates directed self-assembly of the polymer domains. The additive polymer is a bottlebrush polymer. In an embodiment, the composition comprises an intimate mixture of the complete volumes of the block copolymer and the additive polymer without either the block copolymer and the additive polymer undergoing phase separation. In other words, the composition comprising the block copolymer and the additive polymer is in the form of a single phase and is homogeneous throughout its entire volume. In another embodiment, the composition comprises a solvent in addition to the block copolymer and the additive polymer. The solvent is compatible with one or both of the block copolymer and the additive polymer.

In directed self-assembly (DSA), it is desirable to achieve a desired morphology that is defect-free and that can be annealed to a thermodynamic minimum defect state or to a defect free state within a useful short time. One manner of accomplishing this is by blending a "bottlebrush" polymer with a block copolymer. This combination provides improved self-assembly of the block copolymer (BCP) because the bottlebrush polymer (BB) acts as a "scaffold" in promoting self-assembly. The shape of the bottlebrush polymer topology and the general stiffness of the chain backbone cause favorable constraints on its placement into a film or into a confined volume such as a trench or in a contact hole. Thus the graft (polymer) arms of the bottlebrush polymer create regions within the film where it is energetically favorable for compositionally similar or chemically compatible blocks of the block copolymer to associate. As a result, the block copolymer aligns with the grafted arms of the bottlebrush polymer. If the bottlebrush polymer is long enough (e.g., has a high enough molecular weight chain backbone), the grafts along the chain backbone will create extended domains of structurally similar polymer units, which will then scaffold extended association of the similar block of the block copolymer. A scaffold is an orientation framework that assists to guide or template the proper position of the majority block copolymer. As a further result, the block copolymer will be scaffolded into forming extended regions of perfectly aligned self-assembly. If the composition of a block copolymer which forms a cylindrical morphology and bottlebrush polymer is disposed in a contact hole on a substrate, and is long enough to be vertically placed (i.e. its chain backbone length is greater than the size of the cylinder phase formed by self-assembly of the block copolymer and can thus span across the domains spacing or pitch of the self-assembled block copolymer), it will then scaffold the block copolymer also within the contact hole to make extended domains of uninterrupted self-assembled block copolymer, creating a core cylindrical region within the contact hole. The core cylindrical region can be etched away later, forming a highly symmetrical and round hole of a smaller dimension than the original contact hole. The advantages of this invention are a much broader process window and a lack of defects caused by interrupted self-assembled domains within the contact hole.

FIGS. 2(A)-2(F) depicts one of the problems that occurs when disposing a block copolymer on a substrate. The substrate 100 has disposed thereon a photoresist 102 with holes 104 of diameter $d_1$ disposed therein as seen in the FIG. 2(A). The holes are filled with a block copolymer 106 such as poly(styrene-b-methylmethacrylate) (where "b" stands for block), as seen in the FIG. 2(B). The polymethylmethacrylate forms a cylinder 108 (also called a core 108) in the center of the hole, while the polystyrene 107 surrounds it. The core 108 is then etched away leaving a hole 110 that is then used to facilitate the development of a hole 112 in the substrate 100 as seen in the FIG. 2(C). However, in order for the hole 112 to be formed in the substrate, it is desirable to have a continuous polymethylmethacrylate core that extends from the upper surface of the block copolymer to the bottom as seen in the FIG. 2(B). This is not always the case depending upon the diameter of the hole in the photoresist.

As the hole diameter increases from $d_1$ to $d_2$ as seen in the FIG. 2(D), the polymethylmethacrylate core 108 does not always form a continuous cylinder 108. In the FIG. 2(E), it can be seen that instead of forming a continuous cylinder, the polymethylmethacrylate forms a series of cylindrical discs 114. The formation of these discs is considered a defect in that they prevent the formation of a continuous hole that extends almost to the substrate as seen in the FIG. 2(F). In summary, if the holes in the photoresist are not of the appropriate diameter, defects in the form of missing holes are observed.

It has inadvertently been discovered that by using a composition that contains a small amount of a bottlebrush polymer or copolymer in conjunction with a block copolymer, continuous cylindrical domains can be produced in holes or trenches disposed upon a substrate. The bottlebrush has an extended backbone (because of the presence of the grafted polymeric arms that prevent it from behaving like a regular coiled polymer) that makes it perform like a nano-scale cylinder. Without being limited to theory, it is believed that by designing the brush polymer to be capable of segregating into the cylinder 108 (see FIGS. 2(A)-2(F)) and being long enough to extend across the domains spacing or pitch of the self assembled block copolymer, it can stitch together the broken domains. This is demonstrated in the FIGS. 3(A) and 3(B), where cylindrical discs 114 are formed when no bottlebrush is present (see FIG. 3(A)) and where a continuous cylindrical core 108 is formed when a bottlebrush 116 is embedded within the core of the cylinder phase in a manner where its orientation is perpendicular to the substrate (see FIG. 3(B)).

The block copolymer comprises a first polymer and a second polymer, while the additive polymer comprises a bottlebrush copolymer. In one embodiment, the additive polymer is a bottlebrush polymer that comprises a single polymer or copolymer that has a free energy (or a surface tension) that lies between that of the first polymer and the second polymer. In another embodiment, the bottlebrush polymer may comprise a single polymer that has a surface tension that is equal to the surface tension of either the first polymer or the second polymer of the block copolymer. In this embodiment, the additive polymer may be a polymer that comprises only a single polymer (where both the chain backbone and the graft polymers are identical) that is chemically identical with or substantially chemically similar to the first polymer of the block copolymer or that is chemically identical with or substantially chemically similar to the second polymer of the block copolymer. When the bottlebrush polymer comprises a single polymer, both the chain backbone and the graft polymer (the arms) contain the same polymer.

In another embodiment, the additive polymer may be a polymer comprising a third polymer that is chemically identical with or substantially chemically similar to the first polymer of the block copolymer and a fourth polymer that is chemically identical with or substantially chemically similar to the second polymer of the block copolymer. The third polymer may be the chain backbone while the fourth polymer may be the graft polymer or alternatively, the third polymer may be the graft polymer while the fourth polymer may be the chain backbone.

In one embodiment, the additive polymer is a bottlebrush copolymer that comprises different polymers where the surface energy (or the surface tension) of the respective polymers are higher and lower than those of the individual polymers of the block copolymer, but where the average surface energy of the additive polymer lies between that of the first polymer and the second polymer of the block copolymer. In one embodiment, the surface energy of the chain backbone (of the bottlebrush polymer) may be higher than that of the first and the second polymer of the block copolymer, while the surface energy of the graft polymers (the arms) may be lower than that of the first and the second polymer of the block copolymer. In another embodiment, the surface energy of the graft polymers (of the bottlebrush polymers) may be higher than that of the first and the second polymer of the block copolymer, while the surface energy of the chain backbone may be lower than that of the first and the second polymer of the block copolymer.

Prior to being disposed on the substrate, the entire volume of the additive polymer and the entire volume of the block copolymer are intimately mixed together with a solvent in a vessel and in this blended state the domains of the block copolymer are not segregated (i.e., they are not phase separated and exist in the form of a single homogeneous phase) from each other or from the additive polymer. After being disposed on the substrate, the domains of the block copolymer phase separate from each other vertically and the additive polymer segregates into a domain formed by the block copolymer. In another embodiment, after being disposed on the substrate, the additive polymer segregates to the free surface of the film (i.e the air-polymer interface) to facilitate phase separation and vertical alignment of the block copolymer.

When the domains of the block copolymer phase separate to form cylinders, the longitudinal axis of the cylinders are perpendicular to a surface of the substrate. In some embodiments, a substrate modification polymer is also employed that functions as a substrate modification layer of the FIG. 1 and enables the separation of the block copolymer into vertical cylindrical domains after the composition is disposed on a substrate. The substrate modification polymer has a reactive group capable of bonding with the substrate. By mixing the substrate modification polymer with the block polymer and bottlebrush polymer prior to deposition on a substrate that is to be etched, the substrate modification polymer functions as an embedded substrate modification layer—i.e., it separates from the composition after deposition on a substrate and the reactive group reacts with the substrate. By having the substrate modification polymer comprise a polymer that has a surface tension that lies between the first and the second polymers of the block copolymer or by having an substrate modification polymer comprise a copolymer comprising the same or similar polymers as the first and second monomers used to form the block copolymer, the composition can facilitate directed self-assembly of the polymer domains when cast upon a substrate. The mixing of the substrate modification polymer with the block copolymer prior to deposition on a substrate permits the use of a one-step process for manufacturing patterns on substrates.

Disclosed herein too is a method of using the aforementioned composition to facilitate the directed self-assembly of the polymer domains of the composition. The method comprises blending the additive polymer and the block copolymer together and applying them in a single coating and annealing step or alternatively, in a series of coating and annealing steps. This method is versatile and robust in that it permits a range of compositions (e.g., a range of polymer molecular weights and a range of weight percents) to be used for the block and additive polymers, while providing for better domain alignment than that which can be achieved by the process depicted in the FIG. 1. Surprisingly, this process not only simplifies the process by reducing the number of coat and bake steps, but the process window to achieve good directed self-assembly is significantly improved over the two-step process that is detailed in the FIG. 1 and that is presently used in industry.

As detailed above, the composition includes a block copolymer and an additive polymer where the polymers that form the block copolymer are either similar or substantially similar in chemical character to the polymers that are used in the additive polymer.

The first polymer and the second polymer are chemically different from one another and are arranged in blocks in the block copolymer. The block copolymer can be a multiblock copolymer. In one embodiment, the multiblocks can include diblocks, triblocks, tetrablocks, and so on. The blocks can be part of a linear copolymer, a branched copolymer where the branches are grafted onto a backbone (these copolymers are also sometimes called "comb copolymers"), a star copolymer, or the like. The blocks can also be arranged in gradients, where the blocks are arranged in increasing molecular weight from one end of the polymer chain to the other end. In an exemplary embodiment, the block copolymer is a linear diblock copolymer. The block copolymer does not have a reactive functionality on it when it is contained in the composition.

The first polymer or the second polymer of the block copolymer and of the additive polymer are different from one another and may be a polystyrene, a poly(meth)acrylate, a polyacetal, a polyolefin, a polyacrylic, a polycarbonate, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polyetherketone, a polyether etherketone, a polyether ketone ketone, a polybenzoxazole, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polysulfide, a polythioester, a polysulfone, a polysulfonamide, a polyurea, a polyphosphazene, a polysilazane, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polysiloxane, or the like, or a combination comprising at least one of the foregoing polymers.

Exemplary block copolymers that are contemplated for use include diblock or triblock copolymers such as poly (styrene-b-vinyl pyridine), poly(styrene-b-butadiene), poly (styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly (styrene-b-isoprene-b-ethylene oxide), poly(styrene-b-dimethylsiloxane), poly(styrene-b-trimethylsilylmethyl methacrylate), poly(methyl methacrylate-b-dimethylsiloxane), poly(methyl methacrylate-b-trimethylsilylmethyl methacrylate), or the like, or a combination comprising at least one of the foregoing block copolymers.

In an embodiment, the additive polymer is a bottlebrush polymer or copolymer where the surface tension of the polymer or copolymer lies between the surface tension of the first polymer and that of the second polymer. As noted above, the bottlebrush polymer may comprise a polymeric chain backbone and a grafted polymer (that is grafted onto the chain backbone) both of which comprise a single polymer (e.g., a third polymer). In other words, the polymeric chain backbone and the graft polymer both comprise the third polymer. The third polymer comprises polymers such as poly(aromatics) and poly(alkenyl aromatics) (polystyrene, poly(t-butylstyrene) poly(2-vinyl pyridine), and the like), poly(alkyl (meth)acrylates) (poly(methyl methacrylate), poly(ethyl methacrylate), poly(trimethylsilylmethyl methacrylate), and the like), polybutadiene, polyisoprene, polysiloxanes (polydimethylsiloxane, poly(methylphenylsiloxane); or the like, or a combination thereof. The combination includes the use of two bottlebrush polymers without them having a bond that links them together. In one exemplary embodiment, the polymeric chain backbone and the grafted polymer both comprise either a polystyrene or a polyalkyl(meth)acrylate.

In another embodiment, the bottlebrush polymer can comprise a graft polymer where the polymeric chain backbone is different from the graft polymer. The polymeric chain backbone is termed the third polymer while the graft polymer is termed the fourth polymer. In one embodiment, a polymer that is used as the polymer chain backbone in one bottlebrush polymer may be used as the graft polymer in another bottlebrush polymer, while the graft polymer in one bottlebrush polymer may be used as the polymer chain backbone in another bottlebrush polymer.

In one embodiment, the backbone polymer can be one that comprises a strained ring along the chain backbone. In another embodiment, the backbone polymer can be a polyacetal, a polyacrylic, a polycarbonate, a polystyrene, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polytetrafluoroethylene, a polyetherketone, a polyether etherketone, a polyether ketone ketone, a polybenzoxazole, a polyoxadiazole, a polybenzothiazinophenothiazine, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polynorbornene, a polysulfide, a polythioester, a polysulfonamide, a polyurea, a polyphosphazene, a polysilazane, a polyurethane, or the like, or a combination including at least one of the foregoing polymers. In an exemplary embodiment, the backbone polymer is polynorbornene. The ring of the polynorbornene repeat units may, if desired, be substituted with an alkyl group, an araalkyl group, or an aryl group. In another exemplary embodiment, the backbone polymer is poly(norbornene-2,3-dicarboximide).

Examples of graft copolymers are poly(styrene-g-vinyl pyridine), poly(vinyl pyridine-g-styrene), poly(styrene-g-butadiene), poly(butadiene-g-styrene), poly(styrene-g-isoprene), poly(isoprene-g-styrene), poly(styrene-g-methyl methacrylate), poly(methyl methacrylate-g-styrene), poly(t-butylstyrene-g-methyl methacrylate), poly(methyl methacrylate-g-t-butylstyrene), poly(styrene-g-alkenyl aromatics), poly(alkenyl aromatics-g-styrene), poly(isoprene-g-ethylene oxide), poly(ethylene oxide-g-isoprene), poly(styrene-g-(ethylene-propylene)), poly(ethylene-propylene)-g-styrene), poly(ethylene oxide-g-caprolactone), poly(caprolactone-g-ethylene oxide), poly(ethylene oxide-g-caprolactone), poly(butadiene-g-ethylene oxide), poly(ethylene oxide-g-butadiene), poly(styrene-g-t-butyl (meth) acrylate), poly((t-butyl (meth)acrylate)-g-styrene), poly(t-butyl methacrylate-g-methyl methacrylate), poly(ethylene oxide-g-propylene oxide), poly(propylene oxide-g-ethylene oxide), poly(styrene-g-tetrahydrofuran), poly(tetrahydrofuran-g-styrene), poly(styrene-g-isoprene-g-ethylene oxide), poly(styrene-g-dimethylsiloxane), poly(dimethylsiloxane-g-styrene), poly(t-butylstyrene-g-dimethylsiloxane), poly(dimethylsiloxane-g-t-butylstyrene), poly(styrene-g-trimethylsilylmethyl methacrylate), poly(trimethylsilylmethyl methacrylate-g-styrene), poly(methyl methacrylate-g-dimethylsiloxane), poly(dimethylsiloxane-g-methyl methacrylate), poly(methyl methacrylate-g-trimethylsilylmethyl methacrylate), poly(trimethylsilylmethyl methacrylate-g-methyl methacrylate), poly(norbornene-g-polystyrene), poly(norbornene-g-polymethylmethacrylate), poly (norbornene-g-poly(styrene-r-methylmethacrylate)), poly (norbornene-g-polystyrene-g-polymethylmethacrylate), poly(norbornene-2,3-dicarboximide-g-polymethylmethacrylate), poly(norbornene-2,3-dicarboximide-g-polystyrene), poly(norbornene-g-poly(styrene-r-methylmethacrylate)), or the like, or a combination thereof. The term "combination" includes the use of two bottlebrush copolymers without them having a bond that links them together.

In an embodiment, the additive polymer comprises a bottlebrush copolymer that is chemically identical with the first polymer or the second polymer. In other words, the polymer chain backbone (i.e., the third polymer) is chemically similar to the first polymer, while the polymer graft (i.e., the fourth polymer) is chemically similar to the second polymer. In this event, the polymers used in the additive polymer may be selected from the list of polymers detailed above. In an embodiment, the polymer used in the additive polymer is not chemically identical with but is substantially similar to the first polymer or to the second polymer. In other words, the polymer chain backbone (i.e., the third polymer) is not chemically identical with but is substantially similar to the first polymer, while the polymer graft (i.e., the fourth polymer) is not chemically identical with but is substantially similar to the second polymer.

The substrate modification polymers are functionalized with a reactive group to facilitate bond formation or complexation or coordination with the substrate that the composition is disposed on. The reactive groups are detailed below.

In an embodiment, the first polymer of the block copolymer as well as one of the polymer chain backbone or the graft polymer (sometimes referred to as the third polymer herein) of the additive polymer is a vinyl aromatic polymer (e.g., polystyrene or its derivatives), while the second polymer as well as the graft polymer of the additive polymer is an ethylenically unsaturated polymer (e.g., an acrylate polymer or its derivatives). The first polymer and the third polymer is derived from a vinyl aromatic monomer having the structure of formula (1):

wherein $R^5$ is hydrogen, an alkyl or halogen; $Z^1$ is hydrogen, halogen, a hydroxyl or an alkyl; and p is from 1 to about 5.

The vinyl aromatic monomers that can be polymerized to produce the first polymer of the copolymer of the block copolymer and/or of the additive polymer are styrenes, alkylstyrenes, hydroxystyrenes or chlorostyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, p-tert-butylstyrene, 4-tert-butylstyrene, or the like, or a combination comprising at least one of the foregoing alkylstyrene monomers. An exemplary first polymer (for the block copolymer) and for the polymeric chain backbone of the additive polymer is polystyrene or poly(4-tert-butylstyrene).

As noted above, the first polymer of the block copolymer can be either similar or substantially similar in chemical character to a third polymer that is used in the additive polymer. When the first polymer of the block copolymer is substantially similar in chemical character to a third polymer that is used in the additive polymer, the first polymer of the block copolymer can be one of a styrene, an alkylstyrene, a hydroxystyrene or a chlorostyrene, while the third polymer of the additive polymer can be one of a styrene, an alkyl-styrene, a hydroxystyrene or a chlorostyrene so long as the first polymer of the block copolymer is not chemically identical with the third polymer of the additive polymer. In other words, while the first polymer of the block copolymer is not chemically identical with the third polymer of the additive polymer, the two form polymers that are chemically compatible with one another (i.e., they are miscible with one another in all proportions).

The molecular weight of the first polymer of the block copolymer is selected based upon the target pitch of the copolymer when it is disposed upon a substrate. The pitch is the average center to center distance between successive domains of a particular block when the composition is disposed upon a substrate. The pitch generally increases with increasing molecular weight and so controlling the molecular weight of the first polymer can be used to control the pitch. In a preferred embodiment, the weight average molecular weight ($M_w$) of the first polymer is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min).

The polydispersity index of the first polymer is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The second polymer of the block copolymer as well as one of the polymer chain backbone or the graft polymer (also known as the fourth polymer herein) of the additive polymer is derived from the polymerization of an acrylate monomer. In one embodiment, the second polymer and the fourth polymer is obtained from the polymerization of units having a structure represented by formula (2):

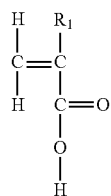

(2)

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, butyl acrylate, or the like, or a combination comprising at least one of the foregoing acrylates.

In one embodiment, the second polymer or the fourth polymer has a structure derived from a monomer having a structure represented by the formula (3):

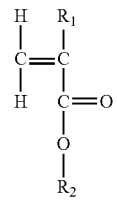

(3)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the (α-alkyl)acrylates are methacrylate, ethacrylate, propyl acrylate, methyl methacrylate, ethyl methacrylate, propyl methacrylate, or the like, or a combination comprising at least one of the foregoing acrylates. The term "(α-alkyl)acrylate" implies that either an acrylate or (α-alkyl)acrylate is contemplated unless otherwise specified.

As noted above, the second polymer of the block copolymer can be either similar or substantially similar in chemical character to one of the third or the fourth polymer that is used in the additive polymer or to the single polymer that is used in the additive polymer (when the polymer chain backbone and the graft polymer are identical in composition). In an embodiment, the second polymer of the block copolymer can be one of an acrylate or an alkyl acrylate, while one of the third or the fourth polymer of the additive polymer can be one of an acrylate or an alkyl acrylate so long as the second polymer of the block copolymer is not chemically identical with the third or the fourth polymer of the additive polymer. In other words, while the second polymer of the block copolymer is not chemically identical with the third and the fourth polymer of the additive polymer, the two are chemically compatible with one another (i.e., they are miscible with one another in all proportions).

The weight average molecular weight ($M_w$) of the second polymer is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min). The polydispersity index of the second polymer is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min). In order to convert a weight average molecular weight to a number average molecular weight, the weight average molecular weight as measured by gel permeation chromatography (GPC) instrument using THF as the mobile phase at a flow of 1 milliliter per minute (mL/min) is divided by the polydispersity index as determined by size exclusion chromatography (SEC) with chloroform as the mobile phase (at 35° C. and a flow rate of 1 mL/min).

When hole or post patterns (when the block copolymer phase segregates to form cylinders) are desired, the block copolymer is selected from a composition and molecular weight that result in formation of a cylindrical morphology when disposed singularly on a substrate and annealed to form domains. The first polymer is present in the first block copolymer in an amount sufficient to form a cylindrical morphology, in an amount of 15 to 35 wt %, specifically 20 to 30 wt %, based on the total weight of the block copolymer. Accordingly, the second polymer is present in the first block copolymer in an amount of 85 to 65 wt %, specifically 80 to 70 wt %, based on the total weight of the block copolymer.

The polydispersity index of the block copolymer is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min).

The weight average molecular weight of the block copolymer is about 2 to about 200, more specifically about 3 to about 150 kilograms per mole as determined using multi-angle laser light scattering gel permeation chromatography and the polydispersity index. In an exemplary embodiment, it is desirable for the block copolymer to have a weight average molecular weight of about 5 to about 120 kilograms per mole.

The block copolymer has an interdomain spacing as measured by small angle xray scattering of less than or equal to about 60 nanometers, specifically less than or equal to about 50 nanometers, more specifically less than or equal to about 40 nanometers.

In an embodiment, the composition may comprise two or more block copolymers—a first block copolymer, a second block copolymer, a third block copolymer, and so on, where each block copolymer has a different molecular weight or volume percent. In an exemplary embodiment, the composition may comprise two block copolymers—a first block copolymer and a second block copolymer, each of which comprise the same first polymer and the same second polymer, but where the first block copolymer has a different molecular weight or volume percent from the second block copolymer. In an embodiment, the first block copolymer has a lower molecular weight than the second block copolymer.

In another embodiment, the composition may comprise two or more block copolymers—a first block copolymer and a second block copolymer, where at least one of the polymers—either the first polymer and/or the second polymer of the first block copolymer are not chemically identical with the first polymer and/or second polymer of the second block copolymer but are chemically compatible with one another (i.e., they are miscible with one another in all proportions). For example, the composition may comprise two block copolymers and the additive polymer. The first block copolymer comprises polystyrene and polymethylmethacrylate blocks, while the second block copolymer comprises polyhydroxystyrene and polymethylmethacrylate and has a different molecular weight from the first block copolymer. The additive polymer can comprise, for example, a polystyrene chain backbone and a polymethylmethacrylate or polyethylmethacrylate graft polymer. In an exemplary embodiment, the composition comprises two block copolymers having identical first polymers and identical second polymers but having different molecular weights.

The block copolymer is present in the composition in an amount of 80 to 99 wt %, preferably 85 to 98 wt %, based on the total weight of the block copolymer and the additive polymer in the composition. In an exemplary embodiment, the block copolymer is present in an amount of 90 to 97 wt %, based on the total weight of the block copolymer and the additive polymer in the composition.

As detailed above, in one embodiment, the substrate modification polymer comprises at least two polymers (one being the polymeric chain backbone and the other being the polymer graft that is grafted onto the chain backbone) that are chemically identical to the two polymers of the block copolymer, but that are arranged in the form of a bottlebrush polymer. In another embodiment, one or both polymers of the substrate modification polymer can be chemically different from one or both monomers used to make the block copolymer but their respective polymers have a chemical affinity (i.e., they are miscible with one another in all proportions) for the one or both polymers of the block copolymer. The substrate modification polymer generally has one or more reactive groups that can facilitate a reaction with the substrate (i.e., between the additive polymer and the substrate) but does not undergo reaction with itself or other components of the additive polymer (in other words, it does not become crosslinked after processing on the substrate). In this fashion, the substrate modification polymer forms a brush layer with self-limiting thickness. The substrate modification polymer also does not undergo any reaction with the block copolymer. In an exemplary embodiment, the reactive end group can be a hydroxyl moiety, an ester moiety, a carboxylic acid moiety, an amine moiety, a thiol moiety, or the like.

When the additive polymer is a bottlebrush polymer, the polymeric chain backbone has a weight average molecular weight of 1000 to 100000 grams per mole, preferably 5000 to 50000 grams per mole. The graft polymer has a weight average molecular weight of 500 to 100000 grams per mole, preferably 1000 to 20000 grams per mole. The graft polymer may be disposed along the entire length of the polymeric chain backbone or along only a portion of the polymeric chain backbone. The average molecular weight between successive grafts disposed on the polymeric chain backbone is 100 to 500 grams per mole. In an exemplary embodiment, the graft polymer may be disposed along the entire length of the polymeric chain backbone.

When the additive polymer is a bottlebrush copolymer, the polymeric chain backbone is present in an amount of 90 to 50 mol %, specifically 75 to 50 mol %, based on the total moles of backbone and graft polymer. Accordingly, the graft polymer is present in the copolymer in an amount of 10 to 50 mol %, specifically 25 to 50 mol %, based on the total moles of backbone and graft polymer. In an exemplary embodiment, if the bottlebrush is a homopolymer of the macromonomer, then the molar ratio of backbone to graft is 1:1.

The polydispersity index of the polymer chain backbone is less than or equal to about 3, specifically less than or equal to about 2 and specifically less than or equal to about 1.50 when determined by size exclusion chromatography (SEC) with tetrahydrofuran or chloroform as the mobile phase (at 35° C. and a flow rate of 1 mL/min). The polydispersity index of the graft polymer is less than or equal to about 3, specifically less than or equal to about 2 and specifically less than or equal to about 1.50 when determined by size exclusion chromatography (SEC) with tetrahydrofuran or chloroform as the mobile phase (at 35° C. and a flow rate of 1 mL/min).

The weight average molecular weight of the bottlebrush polymer is about 10 to about 1000 kilograms per mole, more specifically about 50 to about 500 kilograms per mole as determined using multi-angle laser light scattering gel permeation chromatography and the polydispersity index. In an exemplary embodiment, it is desirable for the bottlebrush polymer to have a weight average molecular weight of about 80 to about 300 kilograms per mole.

The additive polymer is present in the composition in an amount of 1 to 20 wt %, specifically 2 to 15 wt % and 3 to 10 wt %, based on the total weight of the block copolymer and the additive polymer in the composition.

In an embodiment, the substrate modification polymer functions as an embedded substrate modification layer (when disposed on a substrate) and can be characterized as having a surface tension that lies between the individual surface tension of the respective polymers that comprise the blocks of the block copolymer. In other words, the surface free energy of the additive polymer lies between the surface free energy of the first polymer and the second polymer of the block copolymer.

In one embodiment, the surface modification layer comprises a substrate modification polymer comprising two or more monomeric or polymeric repeat units that have difference in surface energy of 0.01 to 10 milli-Newton per meter (mN/m), specifically 0.03 to 3 mN/m, and more specifically 0.04 to 1.5 mN/m. For example, neutral layers for polystyrene and polymethylmethacrylate usually comprise styrene and methylmethacrylate, which only have a difference in surface energy of 0.04 mN/m from the respective blocks.

In an embodiment, it is desirable for the substrate modification polymer to form a film with balanced surface tension between the blocks of the block copolymer. Good results are achieved when the surface tensions are equal. This is the only desired feature and a number of materials can achieve this end result.

In an embodiment, the substrate modification polymer comprises a polymer that comprises a reactive functional group that can react with a functional group upon the surface of the substrate to form a brush on the substrate. The substrate modification polymer is then described as being in the form of a brush on the surface of the substrate.

The substrate modification polymer has a lower number average molecular weight than that of the block copolymer and can comprise a different number of moles of the first monomer or polymer (also called the third polymer) and the second monomer or polymer (also called the fourth polymer) when compared with the block copolymer.

In an exemplary embodiment, the substrate modification polymer has a number average molecular weight of 5 to 100 kilograms per mole, preferably 7 to 50 kilograms per mole. The polydispersity index for the substrate modification polymer is 1.05 to 2.5, preferably 1.10 to 1.60. When the block copolymer is PS-block-PMMA, the substrate modification polymer can be a copolymer of styrene and methylmethacrylate (i.e., a poly(styrene-r-methylmethacrylate)) and comprise 28 to 70 mole percent, preferably 32 to 65 mole percent of polystyrene based on the total number of moles of the substrate modification polymer present in the composition.

Exemplary substrate modification polymers are hydroxyl end-functional poly(styrene-r-methylmethacrylate) (where the "r" between the styrene and the methacrylate stands for "random") or poly(styrener-methyl methacrylate-r-hydoxyethyl methacrylate).

The block copolymer, the additive polymer, and the substrate modification polymer can be manufactured in a batch process or in a continuous process. The batch process or the continuous process can involve a single or multiple reactors, single or multiple solvent and single or multiple catalysts (also termed initiators).

In one embodiment, the block copolymer can contain anti-oxidants, anti-ozonants, mold release agents, thermal stabilizers, levelers, viscosity modifying agents, free-radical quenching agents, other polymers or copolymers such as impact modifiers, or the like. The composition can also include an embedded neutral layer to facilitate perpendicular domain orientation in block copolymers having a large mismatch in surface tension of the first and second blocks. In some embodiments, the bottlebrush polymer can also function as an embedded neutral layer.

In the preparation of the additive polymer, the third monomer (from which the third polymer is obtained) and/or the fourth monomer (from which the fourth polymer is obtained), the solvent(s) and initiators are added to the reaction vessel in the desired ratios. The contents of the vessel are subjected to heat and agitation to produce the additive polymer. The additive polymer is then precipitated from solution and subjected to further processing as is detailed below.

The block copolymer and the additive polymer after purification may be dissolved in a solvent and then disposed upon the surface of a substrate to form a block copolymer film whose blocks are perpendicular in orientation to the surface of the substrate. In one embodiment, the surface of the substrate may contain a brush or crosslinked mat as an optional surface modification layer disposed thereon prior to the disposing of the block copolymer onto the surface of the substrate.

In one embodiment, the substrate may contain a layer of a polymer that is crosslinked after being disposed upon the substrate. The layer is formed by disposing a polymer having reactive substituents along the chain backbone capable of reacting either with itself or a crosslink-inducing additive to form bonds or crosslinks between individual chains of the polymer after it is disposed upon the substrate. A layer crosslinked in this manner is then described as being in the form of a mat or mat-like film on the surface of the substrate. This is distinguished from the bottlebrush polymer, which is not crosslinked on or reacted with the substrate.

The substrate can also be patterned such that some areas result in perpendicular orientation while others induce a parallel orientation of the domains of the composition. The substrate can also be patterned such that some regions selectively interact, or pin, a domain of the block copolymer to induce order and registration of the block copolymer morphology. The substrate can also have topography that induces the alignment and registration of one or more of the domains of the composition. The composition after being disposed upon the substrate is optionally heated to a temperature of up to 350° C. for up to 4 hours to both remove solvent and to form the domains in an annealing process. Preferred annealing temperatures are dependent on the specific composition of the polymers employed. Generally, annealing is conducted at a temperature above the highest glass transition temperature of the block copolymer but below the order-disorder transition temperature (i.e. the temperature at which the block copolymer undergoes a transition from an ordered, phase separated state to a homogeneous melt) and the decomposition temperature of the polymers. When PS-b-PMMA is employed as the block copolymer, annealing is generally conducted between 180 to 300° C. The annealing of the composition can be used to vary the interdomain spacing (i.e., the periodicity) of the cylindrical and/or lamellar domains. The size of the domains can also be varied by annealing.

The solvent that the composition is dissolved in prior to being disposed upon the substrate may be one of those listed above. Examples of useful solvents for compatibilizing the composition are propylene glycol monomethyl ether acetate, propylene glycol monomethyl ether, toluene, anisole, n-butylacetate, isobutylisobutyrate, benzyl benzoate, cyclohexanone, methyl-2-hydroxyisobutyrate, gamma-butyrolactone, propylene glycol ethyl ether, ethyl lactate, and the like. A preferred solvent is propylene glycol monomethyl ether acetate.

The domains of the block copolymer upon annealing form perpendicular to the substrate and the first polymer aligns to the pattern created on the first domain to the "pinning" feature on the substrate, and the second polymer forms a second domain on the substrate aligned adjacent to the first domain. One of the domains of the block copolymer (formed from either the first polymer of the copolymer or the second polymer of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The invention is further illustrated by the following non-limiting examples.

EXAMPLES

The following examples are paper examples that demonstrate than when the composition contains a block copolymer and a bottlebrush polymer or copolymer, defects are minimized and cylindrical domains that extend through most of the length of the hole (in the photoresist) are produced. We performed self-consistent field theory (SCFT) simulations on various DSA scenarios for linear diblock copolymers and blends of linear diblocks with bottlebrush polymers. We explored the defect formation energy of a common defect mode as a function of hole size to determine the hole size process window over which low defectivity could be expected. In these simulations, we seed in a defect structure and calculate its free energy, $F_{defect}$, and compare that to the free energy of the defect-free state, $F_{ideal}$. The difference in energy of these two states is defined as the defect formation free energy, $\Delta F_{defect}$:

$$\Delta F_{defect} = F_{defect} - F_{ideal} \qquad (1)$$

Both the linear AB diblock copolymers and the bottle brush copolymers and homopolymers are modeled with the continuous Gaussian chain model (see: Fredrickson, G. H.; "The Equilibrium Theory of Inhomogeneous Polymers." Clarendon Press, Oxford, 2006). The linear AB diblock copolymer is assumed to contain a total of N statistical segments, a fraction f of which are species A. The backbone of the bottle brush polymer is comprised of species C and has $N_C$ statistical segments, while grafted arms of species A and B have, respectively, $N_A$ and $N_B$ statistical segments. The diblock chain length N is used as a reference chain length; the symbol α is used to denote relative chain lengths of the backbone and grafted arms of the bottle brush relative to the diblock length. The grafts (side arms) along the backbone are assumed to be uniformly spaced, with the number of grafts per scaled length of the backbone denoted by σ and fixed at a value of 50, which is representative of the experimental examples. Through-space distances are measured in units of the unperturbed radius of gyration, $R_g$, of the diblock copolymer.

The binary contact interactions between polymer statistical segments are described using Flory-Huggins parameters. The A-B segmental interaction is denoted by χ, the interactions between A or B segments and the confinement boundaries or "walls" in the simulation are denoted by $\chi_{wA}$ or $\chi_{wB}$, respectively, and the interactions between the backbone C of the bottle brush and the other segment types and walls is denoted $\chi_{C-other}$. Since the C backbone is largely shielded by its surrounding grafts at the high grafting densities considered here, the simulations prove insensitive to $\chi_{C-other}$, so we set all such interaction strengths to zero for convenience. Finally, the polymer melt is assumed to be nearly incompressible, so that the sum of A, B, C, and wall densities is uniform in the system.

In summary, the SCFT model and simulation results are described by the following parameters:

| | |
|---|---|
| $\chi N$ | Segregation strength of the AB diblock copolymer |
| $R_g$ | Radius of gyration of the AB diblock copolymer—the reference lengthscale for domain sizes and periods and confinement dimensions. |
| $\chi_w N = (\chi_{wA} N - \chi_{wB} N)/2$ | Segregation strength that controls the relative attraction of A or B polymer segments (of either diblock or bottle brush) to the wall |
| f | Volume fraction of the minority A block of the linear AB diblock copolymer |
| $\chi_{Backbone-other} N$ | Segregation strength of the backbone of the bottlebrush from the other polymer components in the system. Chosen here to be zero. |
| $\alpha_{backbone}$ | Bottlebrush backbone length scaled relative to the linear AB diblock copolymer length, $N_C/N$ |
| $\alpha_{sidearm}$ | A or B graft length of the bottlebrush polymer scaled relative to the linear AB diblock copolymer length, $N_A/N$ or $N_B/N$ |
| σ | Grafting density: the number of grafted arms per scaled length of the bottlebrush backbone, $\alpha_{backbone}$. Chosen here to be 50. |
| $CD_{guide}$ | Critical dimension of the guide hole |

Algorithms for conducting SCFT simulations of such polymer blend models are described in the monograph, Fredrickson, G. H.; "The Equilibrium Theory of Inhomogeneous Polymers." Clarendon Press, Oxford, 2006. A model and algorithm specific to the confined DSA simulations reported here are described in the publication "Microdomain Ordering in Laterally Confined. Block Copolymer Thin Films", A. W. Bosse, C. J. Garcia-Cervera, and G. H. Fredrickson, *Macromolecules* 40, 9570 (2007). A computer code for conducting SCFT simulations of both bulk and confined polymer systems, PolyFTS, is available for license from the University of California, Santa Barbara.

Comparative Example A

Figure 5:
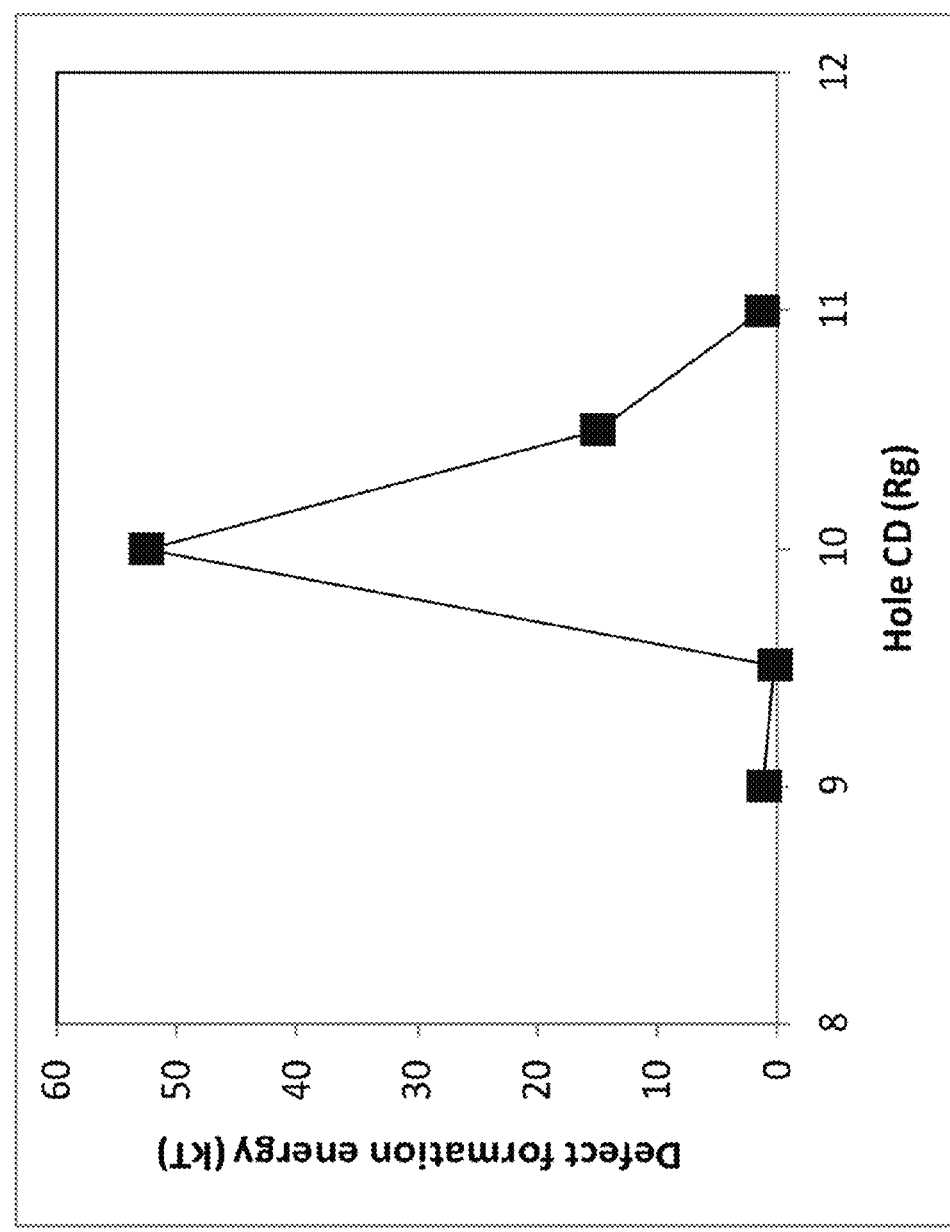
FIG. 5 is a graph showing defect formation energy versus hole critical dimensions for a pure diblock copolymer.
Figure 6:
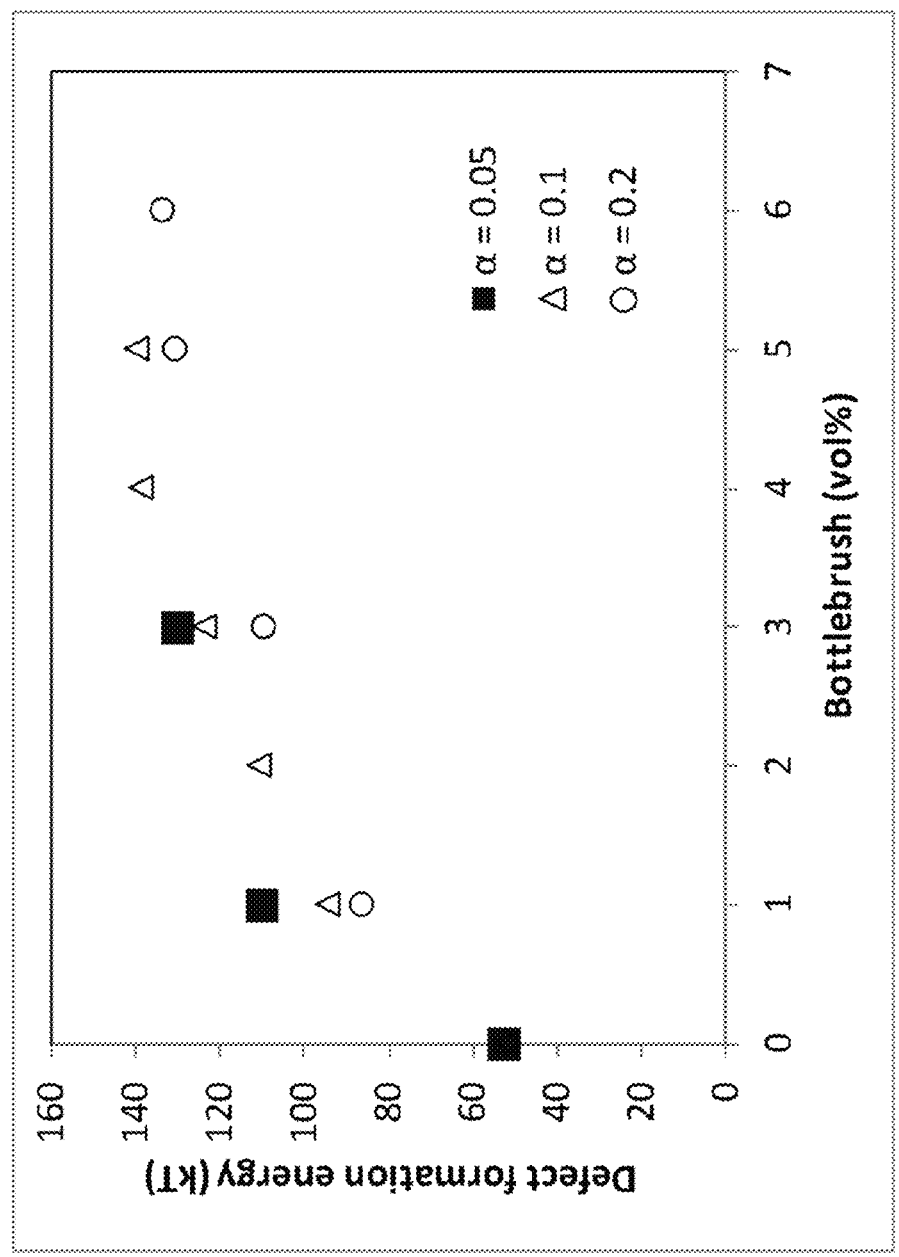
FIG. 6 is a graph showing defect formation energy as a function of bottlebrush loading.

This is a comparative example that demonstrates behavior of a A-B linear block copolymer disposed and annealed in a contact hole (i.e. contact hole shrink). This example does not contain a bottlebrush polymer. It is a paper example that is based off of calculations using self-consistent field theoretical simulations. The structures and defect formation energies for a hole shrink with a linear PS-b-PMMA diblock copolymer were calculated. For the simulation, the following parameters were chosen: PS-b-PMMA was the block copolymer, $f_{PMMA}=0.3$, $\chi N=25$, $\chi_w N=-32$ (minor block A attractive, e.g., PMMA in PS-b-PMMA), and the radius of gyration Rg=7.2 nm. $CD_{guide}$ was varied from 8 to 10 Rg and the hole depth=15 Rg. The calculated structures of the ideal morphology and the "four bead defect" commonly observed for this type of DSA when $CD_{guide}$ deviates from the ideal size are respectively shown in FIGS. 5(A) and 5(B). These structures were calculated for a range of hole CD, and the defect formation energy was then calculated. FIG. 6 shows the defect formation energy (of the four bead defect) as a function of hole CD. When $CD_{guide}$=10 Rg, the defect formation energy reaches a maximum value of ~50 kT. However, the defect formation energy rapidly declines as $CD_{guide}$ moves away from this optimal value, indicating that low defectivity would only occur across a narrow range of $CD_{guide}$ values centered around 10 Rg.

Example 1

This is a paper example that demonstrates hole shrink with linear PS-b-PMMA diblock copolymer/bottlebrush polymer blends. Structures and defect formation energies for hole shrink with a blend of a linear PS-b-PMMA diblock copolymer and a polymethylmethacrylate (PMMA) bottlebrush polymer were calculated. The PMMA bottlebrush polymer has a polymeric chain backbone and graft polymers both of which comprise PMMA. For the simulation, the following parameters were chosen: PS-b-PMMA was the block copolymer, 10 volume percent (%) PMMA bottlebrush was added to the diblock copolymer, $\chi N$=25, $\chi_{Backbone-other}N$=0, $\chi_w N$=−32 (PMMA attractive), $\alpha_{Sidearm}$=0.1, $\alpha_{Backbone}$=0.6, 1.2, 1.8 and 2.4, and the grafting density was chosen to be 50. $CD_{guide}$ was varied from 8 to 10 Rg, and hole depth=15 Rg. Whereas the linear diblock had a defect formation energy of 50 kT at CD=10 Rg and a steep decline away from this optimal $CD_{guide}$ value (FIG. 6), the blends of linear diblock and bottlebrush resulted in an unstable defect that immediately healed to the ideal state across a wide range of $CD_{guide}$. This effect was observed for bottlebrushes at all studied backbone lengths ($\alpha_{backbone}$=0.6, 1.2, 1.8 and 2.4). Since the defect was immediately healed, the defect state is inherently unstable, so no defect formation energy can be calculated. From these simulation results, addition of the bottlebrush gave a much wider process window for DSA relative to the linear diblock of Comparative Example A alone.

Example 2

This is another paper example that demonstrates the effect of bottlebrush loading, i.e. volume fraction in the blend, on hole shrink with linear PS-b-PMMA diblock copolymer/bottlebrush polymer blends.

Figure 7:
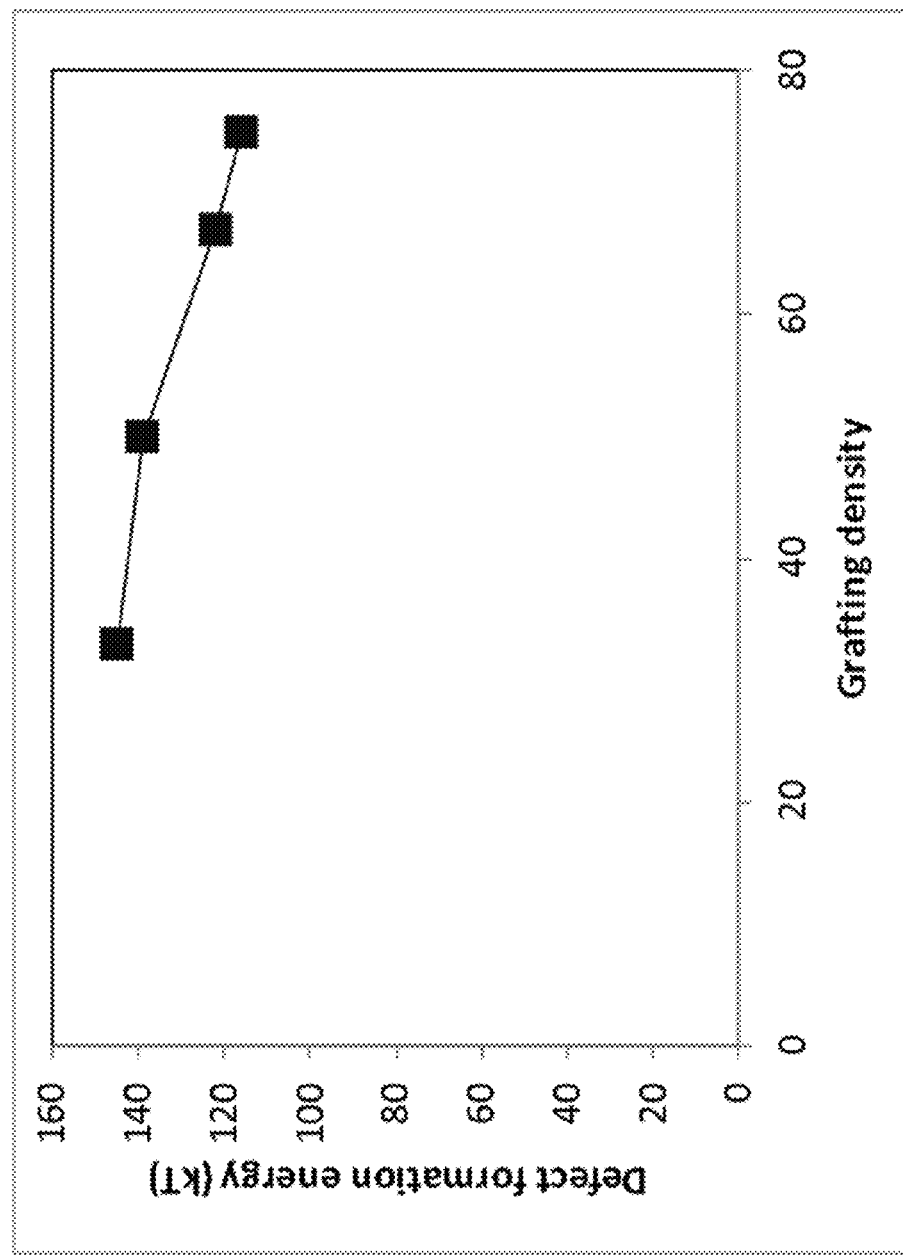
FIG. 7 is a graph showing defect formation energy as a function of bottlebrush loading.

Structures and defect formation energies for hole shrink with a blend of a linear PS-b-PMMA diblock copolymer and a PMMA bottlebrush were calculated, this time with varying loading of the bottlebrush. For the simulation, the following parameters were chosen: PS-b-PMMA was the block copolymer, $\chi N$=25, $\chi_{Backbone-other}N$=0, $\chi_w N$=−32 (PMMA attractive), $\alpha_{Backbone}$=2.4, grafting density of 50, $CD_{guide}$=10 Rg, and hole depth=15 Rg. Three values of bottlebrush arm length were examined, $\alpha_{sidearm}$=0.05, 0.1, and 0.2, and bottlebrush loading was varied from 0 to 10 volume %. Defect formation energy as a function of bottlebrush loading is shown in FIG. 7. For all studied bottlebrush lengths, defect formation energy increased immediately with only 1 vol % bottlebrush and increased further with continuing addition of bottlebrush until the defects became unstable and melted to the perfect state, at which point the defect formation energies were incalculable. The bottlebrush with shortest arms, $\alpha_{sidearm}$=0.05, showed the highest defect formation energies and resulted in totally unstable defects at the lowest volume percentage.

Example 3

This is another paper example that demonstrates the effect of bottlebrush grafting density on hole shrink with linear PS-b-PMMA diblock copolymer/bottlebrush polymer blends. Structures and defect formation energies for hole shrink with a blend of a linear PS-b-PMMA diblock copolymer and a PMMA bottlebrush were calculated, this time with varying the grafting density of the bottlebrush. For the simulation, the following parameters were chosen: PS-b-PMMA was the block copolymer, $\chi N$=25, $\chi_{Backbone-other}N$=0, $\chi_w N$=−32 (PMMA attractive), $\alpha_{sidearm}$=0.1, $\alpha_{Backbone}$=2.4, 4 vol % bottlebrush, $CD_{guide}$=10 Rg, and hole depth=15 Rg. Four values of bottlebrush grafting density were examined, 25, 33, 50, 66 and 75. Defect formation energy as a function of grafting density is shown in FIG. 7. At a grafting density of 25, the defect was unstable and immediately healed to the perfect state. As grafting density increased to 33 and above, the defect formation energies were calculable and decreased slightly from 145 to 116 kT. However, all cases were much higher than the case without bottlebrush in Comparative Example A, which showed a defect formation energy of 52.5 kT.

Example 4

Figure 8:
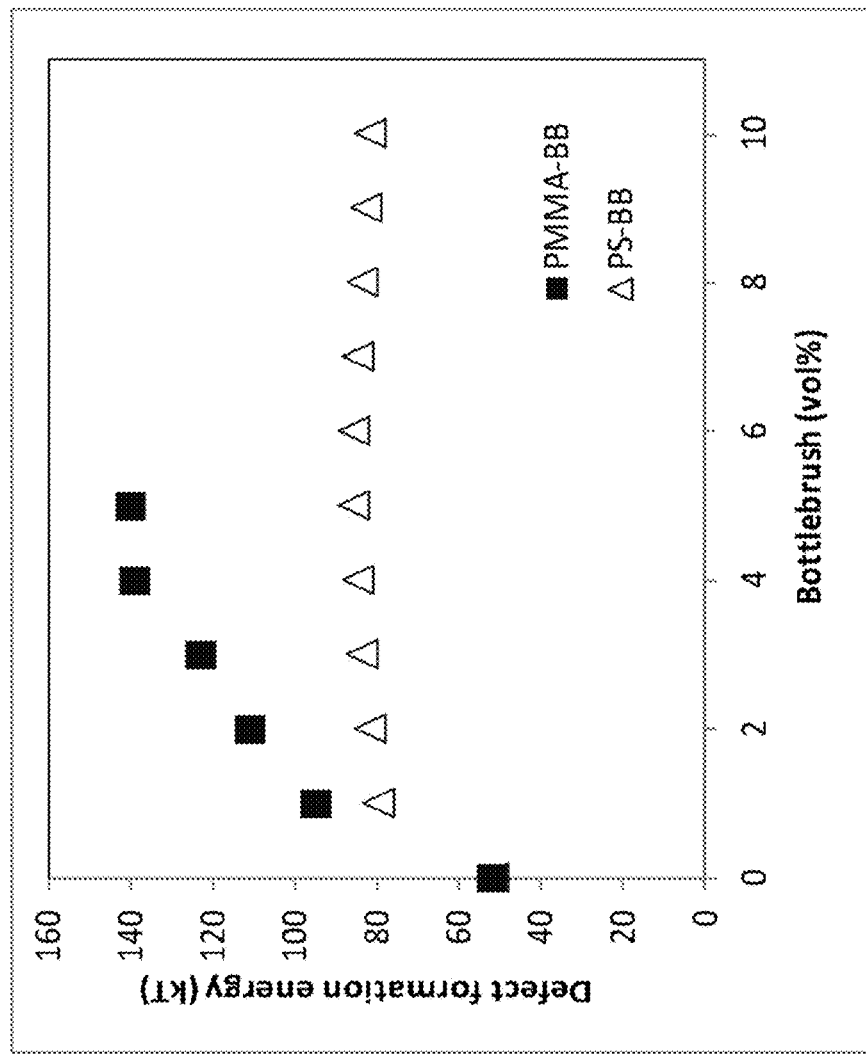
FIG. 8 is a graph showing a comparison of defect formation energy as a function of bottlebrush loading for PMMA-BB and PS-BB.

This is another paper example that details hole shrink with compositions that comprise linear PS-b-PMMA diblock copolymer/bottlebrush polymer blends. Structures and defect formation energies for hole shrink with a blend of a linear PS-b-PMMA diblock copolymer and both polystyrene (PS) and polymethylmethacrylate (PMMA) polymeric bottlebrushes. For the simulation, the following parameters were chosen: PS-b-PMMA was the block copolymer, $\chi N$=25, $\chi_{Backbone-other}N$=0, $\chi_w N$=−32 (PMMA attractive), $\alpha_{Sidearm}$=0.1, $\alpha_{Backbone}$=2.4, grafting density=50, $CD_{guide}$=10 Rg, and hole depth=15 Rg. Various vol % of both PS and PMMA bottlebrushes were added, and the ("four bead") defect formation energies of the corresponding ternary blends are summarized in Table 1 below. Results for binary blends with PMMA-bottlebrushes (BB) and PS-bottlebrushes are shown in the FIG. 8; PMMA-BB was more effective than the PS-BB at increasing the defect formation energy, although both additives did increase the energy over the baseline with no added BB. At a constant loading of PMMA-BB, increasing the volume of PS-BB caused the defects to become slightly less costly until the point that they lost stability. This data shows that blends of linear PS-b-PMMA diblock and both PS-BB and PMMA-BB have better defectivity properties than pure linear diblock copolymers.

Table 1 shows defect formation energy for a linear AB diblock copolymer blended with various amounts of PS-BB and PMMA-BB in a cylindrical prepattern with PMMA-block-attractive walls and substrate. Cells without numbers indicate the defects were unstable and thus their formation energy was incalculable.

TABLE 1

| | | PS-BB (vol %) | | | | | | | | | | |
|---|---|---|---|---|---|---|---|---|---|---|---|---|
| | Vol % | 0 | 1 | 2 | 3 | 4 | 5 | 6 | 7 | 8 | 9 | 10 |
| PMMA-BB (vol %) | 0 | 52 | 80 | 82 | 84 | 85 | 86 | 86 | 85 | 84 | 83 | 82 |
| | 1 | 95 | 95 | 96 | 93 | 91 | 88 | 86 | — | — | — | — |
| | 2 | 111 | 113 | 112 | 100 | 96 | — | — | — | — | — | — |
| | 3 | 123 | 115 | 111 | 107 | — | — | — | — | — | — | — |
| | 4 | 139 | — | — | — | — | — | — | — | — | — | — |
| | 5 | 140 | — | — | — | — | — | — | — | — | — | — |
| | 6 | — | — | — | — | — | — | — | — | — | — | — |
| | 7 | — | — | — | — | — | — | — | — | — | — | — |
| | 8 | — | — | — | — | — | — | — | — | — | — | — |
| | 9 | — | — | — | — | — | — | — | — | — | — | — |
| | 10 | — | — | — | — | — | — | — | — | — | — | — |

Comparative Example B

Figures 9, 9A, 9B:
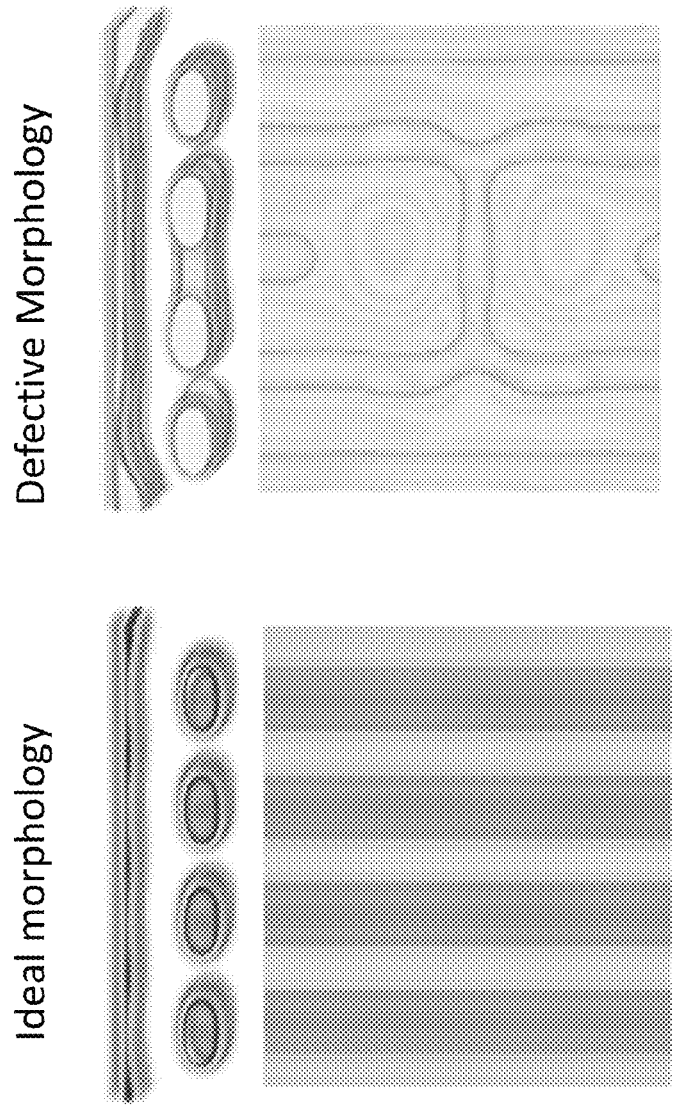
FIG. 9 is a schematic diagram showing ideal and defect morphologies arising from assembly of a linear AB diblock copolymer in a trench pre-pattern with A-block-attractive walls, including top-down and cross-section views.
Figure 10:
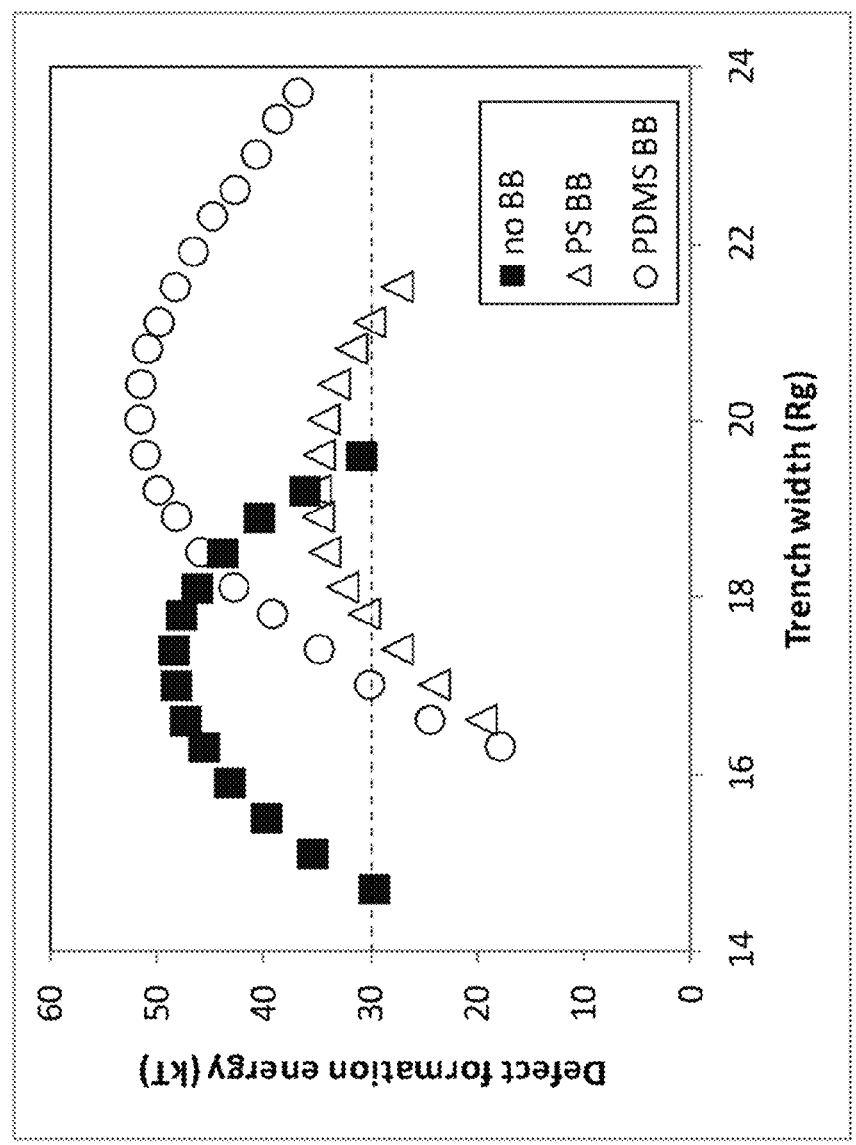
FIG. 10 is a graph showing defect formation energy as a function of trench width for line/space graphoepitaxy with a linear diblock copolymer and linear diblock copolymer/bottlebrush polymer blends.

This is a paper example that demonstrates the effect of bottlebrush grafting density on line/space graphoepitaxy with linear diblock copolymer/bottlebrush polymer blends. In this comparative example, structures and defect formation energies for line/space graphoepitaxy with a linear PS-b-PDMS diblock copolymer were calculated. For the simulation, the following parameters were chosen: PS-b-PDMS was the block copolymer, $\chi N=33$ (corresponding to PS-b-PDMS with $M_n(PS)=44$ kg/mol and $M_n(PDMS)=14$ kg/mol), $\chi_w N=-32$ (minor block PDMS attractive walls), and trench depth=3 Rg (where Rg=6.6 nm). Structures and defect formation energies for the block copolymer in trenches designed to hold four cylinders were calculated. PDMS density maps of the ideal state and a representative "disclination type" defect are shown in FIG. 9. Trench width was varied to study the impact of trench width on defect formation energy, and the results are plotted in FIG. 10. A defect formation energy of >30 kT is required to achieve the desired defect density of <0.01 defects per cm². For the linear diblock, the defect formation energy reached a maximum of 48 kT at a trench width of 17.4 Rg, and the defect formation energy declined as the trench varied away from this optimal value. The process window, defined as the range of trench width for which the defect formation energy was above the 30 kT threshold, was approximately 5 Rg.

Example 5

This is a paper example that demonstrates the effect of bottlebrush grafting density on line/space graphoepitaxy with linear diblock copolymer/bottlebrush polymer blends. Structures and defect formation energies for line/space graphoepitaxy with a blend of a linear PS-b-PDMS diblock copolymer and a bottlebrush polymer with PS arms were calculated. For the simulation, the following parameters were chosen: PS-b-PDMS was the block copolymer, $\chi N=33$ (corresponding to PS-b-PDMS with $M_n(PS)=44$ kg/mol and $M_n(PDMS)=14$ kg/mol), $\chi_{Backbone-other} N=0$, $\chi_w N=-32$ (minor block PDMS attractive), $\alpha_{sidearm}=0.1$, $\alpha_{Backbone}=0.6$, grafting density=50, 10 vol % BB, trench depth=3 Rg (where Rg=6.6 nm). The structures and defect formation energies for the block copolymer in trenches designed to hold four cylinders were calculated. Trench width was again varied to study the impact of trench width on defect formation energy, and the results are plotted in FIG. 11. A defect formation energy of >30 kT is required to achieve the desired defect density of <0.01 defects per cm².

For the case of the bottlebrush with PS arms, the maximum defect formation energy was lower (35 kT) than for the linear diblock in Comparative Example B (48 kT), and the optimal trench width increased to 19.2 Rg. The defect formation energy again decreased as the trench varied away from this optimal value. The process window, defined as the range of trench width for which the defect formation energy was above the 30 kT threshold, was approximately 3 Rg. This shows that adding a bottlebrush polymer comprising arms that are similar in chemistry to those of the majority block, i.e., PS-BB into a PS-b-PDMS diblock with majority PS, gives worse DSA results in a line/space configuration than the neat linear diblock alone.

Example 6

This is another paper example that details the effect of bottlebrush grafting density on line/space graphoepitaxy with linear diblock copolymer/bottlebrush polymer blends. Structures and defect formation energies for line/space graphoepitaxy with a blend of a linear PS-b-PDMS diblock copolymer and a bottlebrush polymer with PDMS arms were calculated. For the simulation, the following parameters were chosen: PS-b-PDMS was the block copolymer, $\chi N=33$ (corresponding to PS-b-PDMS with $M_n(PS)=44$ kg/mol and $M_n(PDMS)=14$ kg/mol), $\chi_{Backbone-other} N=0$, $\chi_w N=-32$ (minor block A attractive), $\alpha_{Sidearm}=0.1$, $\alpha_{Backbone}=0.6$, grafting density=0.5, and trench depth=3 Rg (where Rg=6.6 nm). Structures and defect formation energies for the block copolymer in trenches designed to hold four cylinders were calculated. Two different loadings of the PDMS bottlebrush, 4 vol % and 10 vol %, were examined. Trench width was again varied to study the impact of trench width on defect formation energy, and the results are plotted in FIG. 10.

When 10 vol % of the PDMS bottlebrush was added to the composition, the defects became unstable and were immediately healed to a perfect state. In other words, the cast composition was defect free. Accordingly, the defect formation energy could not be calculated. At only 4 vol % PDMS bottlebrush content in the composition, the maximum defect formation energy was higher (52 kT) than for only the linear diblock in Comparative Example B (48 kT), and the optimal trench width increased to 20 Rg. The defect formation energy again declined as the trench varied away from this optimal value, but the process window where the energy was above 30 kT was approximately 7 Rg, larger than for the linear diblock alone in Comparative Example B (5 Rg).

This data shows adding bottlebrush with minority block preferential arms, i.e., PDMS-BB into a PS-b-PDMS diblock with majority PS, improves both the defect density and process window for line/space graphoepitaxy DSA when compared to the neat linear diblock alone.

Example 7

This is another paper example that details the effect of adding bottlebrush grafting density on line/space graphoepitaxy with linear diblock copolymer/bottlebrush polymer blends. Structures and defect formation energies for line/space graphoepitaxy with blend of a linear PS-b-PDMS diblock copolymer and various loadings of bottlebrush polymers with both PDMS arms (PDMS-BB) and PS arms (PS-BB). For the simulations, the following parameters were chosen: PS-b-PDMS was the block copolymer, $\chi N=33$ ($\chi N$ was scaled by ⅓ for stable SCFT simulations from 100, which corresponds to PS-b-PDMS with $M_n(PS)=44$ kg/mol and $M_n(PDMS)=14$ kg/mol), $\chi_w N=-32$ (minor block PDMS attractive walls), Lx (longitudinal length along the cylinders)=24 Rg, Lz (total depth, polymer filling level)=8 Rg and trench depth=3 Rg (where Rg=6.6 nm). The Rg and energy units are converted from the original $\chi N=100$. We calculated structures and defect formation energies for the block copolymer in trenches designed to hold four cylinders. The trench width was fixed to 20 Rg at which the blend with 4 vol % of PDMS-BB maximizes the defect formation energy. Various vol % of both PS and PDMS bottlebrushes were added, and the defect formation energies are summarized in Table 2. PDMS-BB was more effective than the PS-BB at increasing the defect formation energy, although both additives did increase the energy over the baseline with no added BB until 6 vol % of PS-BB was added. Blends of linear diblock and only PDMS-BB gave the largest increases in defect formation energy but adding PS-BB reduced the decrease of defect formation energy as more PDMS-BB were added. At a constant loading of PDMS-BB, increasing the volume of PS-BB caused the defect formation energy to decrease. It was observed that 3 vol % of PS-BB can maintain the defect formation energies of blends of linear PS-b-PDMS diblock and both PS-BB and PDMS-BB to values greater than the defect formation energy of pure linear diblock, >48 kT, over the entire range of 1 to 9 vol %

PDMS-BB. These data show that blends of linear PS-b-PDMS diblock and both PS-BB and PDMS BB at certain compositions have higher defect formation energies than pure linear diblock PS-b-PDMS. Table 2 shows defect formation energy for a linear PS-b-PDMS diblock copolymer blended with various amounts of PS-BB and PDMS-BB in a trench with PDMS-block-attractive walls.

TABLE 2

|  |  | PS-BB (vol %) | | | | | | | | | |
|---|---|---|---|---|---|---|---|---|---|---|
|  |  | 0 | 1 | 2 | 3 | 4 | 5 | 6 | 7 | 8 | 9 |
| PDMS-BB | 0 | 48 | 49 | 47 | 43 | 23 | 23 | 22 | 22 | 22 | 21 |
| (vol %) | 1 | 63 | 59 | 52 | 50 | 50 | 50 | 50 | 46 | 45 | 44 |
|  | 2 | 64 | 61 | 59 | 54 | 55 | 52 | 50 | 45 | 44 | 43 |
|  | 3 | 57 | 59 | 55 | 55 | 52 | 50 | 48 | 44 | 42 | 42 |
|  | 4 | 53 | 59 | 55 | 52 | 51 | 49 | 46 | 43 | 42 | 41 |
|  | 5 | 48 | 59 | 54 | 52 | 49 | 47 | 45 | 42 | 40 | 39 |
|  | 6 | 45 | 58 | 53 | 52 | 48 | 46 | 43 | 41 | 38 | 36 |
|  | 7 | 42 | 58 | 54 | 49 | 46 | 44 | 42 | 41 | 38 | 35 |
|  | 8 | 39 | 57 | 51 | 48 | 45 | 43 | 43 | 42 | 42 | 40 |
|  | 9 | 38 | 57 | 53 | 53 | 47 | 48 | 46 | 46 | 44 | 44 |

Example 8

This example describes the synthesis of a polystyrene-block-polymethyl-methacryl methacrylate block copolymer. Using standard Schlenk line methods, dry THF (421 mL) was transferred into a dry, argon purged 1 L 3-neck round bottomed flask and cooled to −78° C. using a dry ice/acetone mixture. A 0.36M sec-butyllithium solution (2 mL, 0.72 mmol) was added until a pale yellow color persisted. The flask was then warmed to room temperature and held at 30° C. until the color completely disappeared (approximately 10-15 minutes). The THF solution was cooled back to −78° C. and styrene (25.11 g, 0.24 mol) was transferred to the reaction flask via cannula. A 0.54M sec-Butyllithium initiator solution (0.81 mL, 0.44 mmol) was rapidly added to the reaction flask via syringe, causing a 17° C. exotherm within 1 minute. The reaction mixture cooled back down to −78° C. over the next 10 minutes. The reaction was stirred for a total of 25 minutes and then a small portion of reaction solution was transferred via cannula into a small round bottomed flask containing anhydrous MeOH for GPC analysis of the PS block. Next, a diphenylethylene (0.10 g, 0.55 mmol) solution (diluted in 2.1 mL cyclohexane) was transferred to the THF/polystyrene solution via cannula, causing the reaction mixture to turn from dark yellow to a dark ruby red. The solution was stirred for 10 minutes at approximately −77° C. (measured by internal temperature probe). Next, a methyl methacrylate (10.57 g, 0.11 mol) solution (diluted with 11.0 mL cyclohexane) was transferred into the flask via cannula, which caused the color to completely disappear. Following the MMA addition, the solution warmed to approximately −68° C. within 2 minutes and then cooled back to −77° C. The reaction was stirred for a total of 130 minutes, after which it was quenched by the addition of anhydrous MeOH. The block copolymer solution was precipitated into 1.4 L of methanol and collected by vacuum filtration. The filter cake was then dissolved in 150 mL of CH$_2$Cl$_2$ and washed twice with 100 mL of DI water. The block copolymer solution was precipitated into 1 L of methanol, collected by vacuum filtration and dried in a vacuum oven at 60° C. overnight. Analysis of the composition was completed by $^1$H NMR spectroscopy and the final molecular weight was determined by GPC using a light scattering detector. Composition: 73.2 wt % PS, 26.8 wt % PMMA; Mn=66.9 k g/mol, PDI=1.07.

Example 9

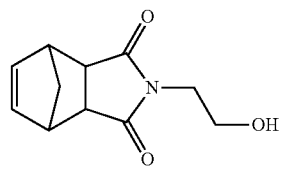 [SMILES: O=C1C2C3C=CC(C3)C2C(=O)N1CCO]

This example describes the synthesis of N-(hydroxyethyl)-cis-5-norbornene-endo(exo)-2,3-dicarboximide. A round bottom flask was flame-dried and charged with cis-5-norbornene-endo(exo)-2,3-dicarboxylic anhydride (2.07 g, 1 eq.) and 2-aminoethanol (800 μL, 1.05 eq.). Toluene (20 mL) and triethylamine (200 μL, 0.11 eq.) were added to the flask, and the mixture was refluxed overnight using Dean-Stark trap. The mixture was then cooled down to room temperature, concentrated using rotary evaporator, redissolved in 40 mL dichloromethane and washed with brine and 0.1 M HCl. The organic layer was dried by adding MgSO4 and concentrated to give the product as a white solid.

Example 10

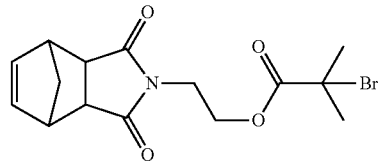 [SMILES: CC(C)(Br)C(=O)OCCN1C(=O)C2C3C=CC(C3)C2C1=O]

This example describes the synthesis of the initiator for atom-transfer radical polymerization (ATRP), 2-(1,3-dioxo-3a,4,7,7a-tetrahydro-1H-4,7-methanoisoindol-2(3H)-yl) ethyl 2-bromo-2-methyl-propanoate, shown above. N-(hydroxyethyl)-cis-5-norbornene-endo(exo)-2,3-dicarboximide (414.5 mg, 1 eq.) was added into a flame-dried, 2 neck round bottom flask, dissolved in anhydrous dichloromethane (5 mL) and added with triethylamine dropwise (1.2 eq.). The mixture was cooled in ice bath and α-bromo isobutyryl bromide (1.2 equiv) was added dropwise. After stirring for 20 hour the mixture was washed with brine and 0.1 M HCl, concentrated, and purified by column chromatography to obtain the ATRP initiator as a white solid.

Example 11

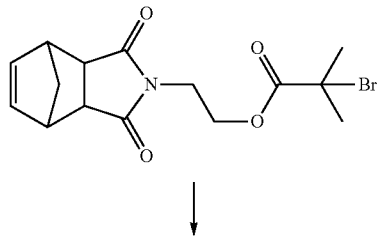

-continued

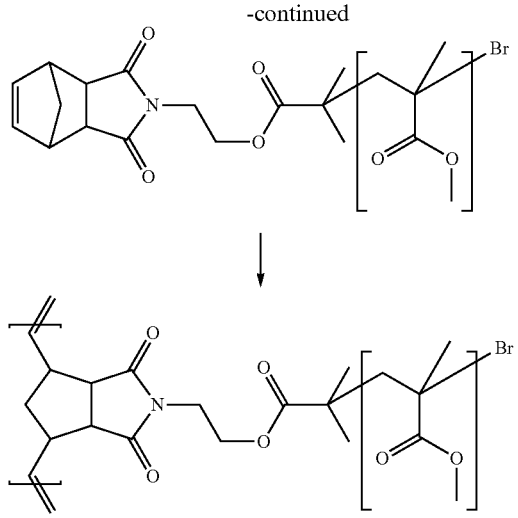

This example describes the synthesis of the bottlebrush polymers with PMMA arms and polynorbornene backbone, poly(norbornene-g-polymethylmethacrylate). 2-(1,3-Dioxo-3a,4,7,7a-tetrahydro-1H-4,7-methanoisoindol-2(3H)-yl) ethyl 2-bromo-2-methyl-propanoate was used as initiator to polymerize methyl methacrylate (MMA) according to the standard preparation of polymer using ATRP with slight modification of the procedure described in Grimaud et al in Macromolecules 1997, 30, 2216-2218 using the following ratios of monomer, initiator, Cu(I)Br, and N,N,N',N',N"-pentamethyldiethylenetriamine (PMDETA) as ligand ([MMA]:[initiator]:[Cu(I)]:[PMDETA]=100:1:0.5:0.5, 90° C.). After the reaction, copper was removed by passing the polymer solution through a basic alumina column, and the polymer was precipitated in cold methanol to obtain the norbornene PMMA macromonomer (PMMA-MM).

Ring-opening metathesis polymerization (ROMP) was then conducted on the PMMA macromonomer (PMMA-MM) (ca. 100 mg) by dissolving it in a minimum amount of degassed, anhydrous solvent ([PMMA-MM]=60-100 mM) and injecting an appropriate amount of Grubbs $2^{nd}$ generation catalyst (1,3-Bis(2,4,6-trimethylphenyl)-2-imidazolidinylidene) dichloro(phenylmethylene)(tricyclohexylphosphine)ruthenium (40-55 mM, in anhydrous, deoxygenated solvent). The mixture was let stirred for overnight, precipitated in cold MeOH, filtered and dried for further analysis. Three different PMMA bottlebrush polymer were made according to this technique, and their characteristics are collected in Table 3.

TABLE 3

Characterization of PMMA-BB polymers.

| Sample | Mn (kg/mol) | Mw/Mn |
|---|---|---|
| PMMA-BB-1 | 95 | 1.24 |
| PMMA-BB-2 | 140 | 1.22 |
| PMMA-BB-3 | 403, 190 (bimodal) | 1.23, 1.24 |

Comparative Example C

This example describes the formulation of a PS-b-PMMA linear block copolymer in solvent. A solution of PS-b-PMMA was prepared by dissolving the polymer (0.050 g) in toluene (4.95 g) to give a 1.0 wt % solution (polymer to total mass). The solution was filtered through a 0.2 μm Teflon filter.

Example 12

This example describes the formulation of a PS-b-PMMA linear block copolymer and a bottlebrush with PMMA arms and polynorbornene backbone (PMMA-BB-1) in solvent in various ratios. PS-b-PMMA and PMMA-BB-1 at various ratios were dissolved in toluene to give 1.0 wt % solutions (polymer to total mass). The solutions were filtered through 0.2 μm Teflon filters. Table 4 shows formulation details.

TABLE 4

| Example | Polymer Comp. | Block Copolymer | Bottle Brush Polymer | Solvent | Polymer Conc. (wt %) |
|---|---|---|---|---|---|
| Comp C. | PC-1 | PS-b-PMMA (0.050 g) | NA | Toluene (4.950 g) | 1.0 |
| 12a | PC-2 | PS-b-PMMA (0.048 g) | PMMA-BB-1 (0.003 g) | Toluene (4.950 g) | 1.0 |
| 12b | PC-3 | PS-b-PMMA (0.045 g) | PMMA-BB-1 (0.005 g) | Toluene (4.950 g) | 1.0 |
| 12c | PC-4 | PS-b-PMMA (0.040 g) | PMMA-BB-1 (0.010 g) | Toluene (4.950 g) | 1.0 |
| 12d | PC-5 | PS-b-PMMA (0.048 g) | PMMA-BB-1 (0.003 g) | Toluene (4.950 g) | 1.0 |
| 12b | PC-6 | PS-b-PMMA (0.045 g) | PMMA-BB-1 (0.005 g) | Toluene (4.950 g) | 1.0 |
| 12e | PC-7 | PS-b-PMMA (0.040 g) | PMMA-BB-1 (0.010 g) | Toluene (4.95 g) | 1.0 |
| 12f | PC-8 | PS-b-PMMA (0.048 g) | PMMA-BB-1 (0.003 g) | Toluene (4.950 g) | 1.0 |
| 12g | PC-9 | PS-b-PMMA (0.045 g) | PMMA-BB-1 (0.005 g) | Toluene (4.950 g) | 1.0 |
| 12h | PC-10 | PS-b-PMMA (0.040 g) | PMMA-BB-1 (0.010 g) | Toluene (4.950 g) | 1.0 |

Comparative Example A

This example demonstrates behavior of a PS-b-PMMA linear block copolymer disposed as a thin film on a silicon substrate and annealed. A hydroxyl-terminated poly(styrene-r-methylmethacrylate) bush (prepared according to the method described by Han et al. in Macromolecules, Vol. 41, No. 23, 2008, p. 9090-9097, with 75 mol % styrene, Mn=10 kg/mol, and Mw/Mn=1.2), was dissolved in toluene to a give 1 wt % solution and filtered through a 0.2 μm Teflon filter. The surface of a silicon substrate having a native oxide layer was then modified by spin coating thereon this brush solution at 1,500 rpm for 30 sec. The substrate was then placed on a hotplate set at 120° C. for 2 minutes and then 220° C. for 60 minutes to anneal the deposited brush layer. The substrate was then rinsed with PGMEA to wash away any unattached polymer by first soaking the substrate in PGMEA for 30 s and then spin drying at 3,000 rpm for 1 minute. The substrate was then baked on a hotplate set at 130° C. for 60 seconds. Thin films were prepared of the PS-b-PMMA formulation described in Comparative Example C by spin coating the solution on the P(S-r-MMA)-OH brushed silicon wafer. The formulation was spin-coated at 2000 rpm onto a brushed substrate, baked on a hot plate at 130° C. for 1 minute, and annealed at 240° C. for 5 minutes under nitrogen. After thermal annealing, the films were subjected to reactive ion etching using a PlasmaTherm 790i RIE, a 8 second $CHF_3$ reactive ion etch followed by a 15 second oxygen reactive ion etch to remove the PMMA. The samples were then imaged by scanning electron microscopy (Hitachi CG4000) at 40,000× and 400,000× magnification to characterize the morphology.

Example 13

This example demonstrates behavior of blends of a PS-b-PMMA linear block copolymer with a bottlebrush with PMMA arms and polynorbornene backbone (PMMA-BB) disposed as a thin film on a silicon substrate and annealed. A hydroxyl-terminated poly(styrene-r-methylmethacrylate) bush (prepared according to the method described by Han et al. in *Macromolecules*, Vol. 41, No. 23, 2008, p. 9090-9097, with 75 mol % styrene, Mn=10 kg/mol, and Mw/Mn=1.2), was dissolved in toluene to a give a 1 wt % solution and filtered through a 0.2 µm Teflon filter. The surface of a silicon substrate having a native oxide layer was then modified by spin coating thereon this brush solution at 1,500 rpm for 30 sec. The substrate was then placed on a hotplate set at 120° C. for 2 minutes and then 220° C. for 60 minutes to anneal the deposited brush layer. The substrate was then rinsed with PGMEA to wash away any unattached polymer by first soaking the substrate in PGMEA for 30 s and then spin drying at 3,000 rpm for 1 minute. The substrate was then baked on a hotplate set at 130° C. for 60 seconds. The substrate was diced into small pieces for further experiments. Thin films were then prepared of the PS-b-PMMA formulations described in Example 12 by spin coating the solution on the P(S-r-MMA)-OH brushed silicon wafer. The formulation was spin-coated at 2000 rpm onto a brushed substrate, baked on a hot plate at 130° C. for 1 minute, and annealed at 240° C. for 5 minutes under nitrogen. After thermal annealing, the films were subjected to reactive ion etching using a PlasmaTherm 790i RIE, a 8 second CHF$_3$ reactive ion etch followed by a 15 second oxygen reactive ion etch to remove the PMMA. The samples were then imaged by scanning electron microscopy (Hitachi CG4000) at 40,000× and 400,000× magnification to characterize the morphology.

Example 14

This example describes synthesis of hydroxyl-terminated polystyrene brushes. Hydroxyl-terminated polystyrene brushes (PS—OH-1 and PS—OH-2) were prepared according to the following procedure, where the monomer to initiator ratio was adjusted to vary the molecular weight. Styrene and 2-hydroxyethyl 2-bromo-2-methylpropanoate (initiator) were dissolved in anisole in a 500 mL round bottom flask. CuBr (0.1 equivalent relative to initiator) and tris[2-(dimethylamino) ethyl] amine (0.1 equivalent relative to initiator) were dissolved in 5 mL anisole in a sample vial. Sn(EH)$_2$ (0.1 equivalent relative to initiator) was dissolved in 5 mL anisole in a sample vial. The three solutions were purged with nitrogen for 1 hour and then combined in the 500 mL flask. The mixture was then heated for 20 h, and the polymer was then precipitated into methanol. The precipitate was then dissolved in THF and treated with an ion exchange resin to remove the Cu catalyst. The reaction mixture was then re-precipitated into methanol. The resulting white powder was filtered and dried overnight at 50° C. Two materials were synthesized, PS—OH-1 with Mn=8.8 kg/mol, and Mw/Mn=1.23, and PS—OH-2 with Mn=37.3 kg/mol, and Mw/Mn=1.23.

Example 15

This example describes synthesis of linear polystyrene-block-polydimethyl-siloxane (PS-b-PDMS) block copolymers. Three linear PS-b-PDMS block copolymers were prepared according to the procedure outlined by Hustad et al. in U.S. Pat. No. 8,821,738. Details of the polymer characterization are given in Table 5.

TABLE 5

| Sample | Mn (kg/mol) | Mw/Mn | PDMS (wt %) | PDMS (vol %) |
|---|---|---|---|---|
| PS-b-PDMS-26 | 39.6 | 1.09 | 24.7 | 26.2 |
| PS-b-PDMS-29 | 40.3 | 1.07 | 27.4 | 29.0 |
| PS-b-PDMS-31 | 39.6 | 1.08 | 29.2 | 30.9 |

Example 16

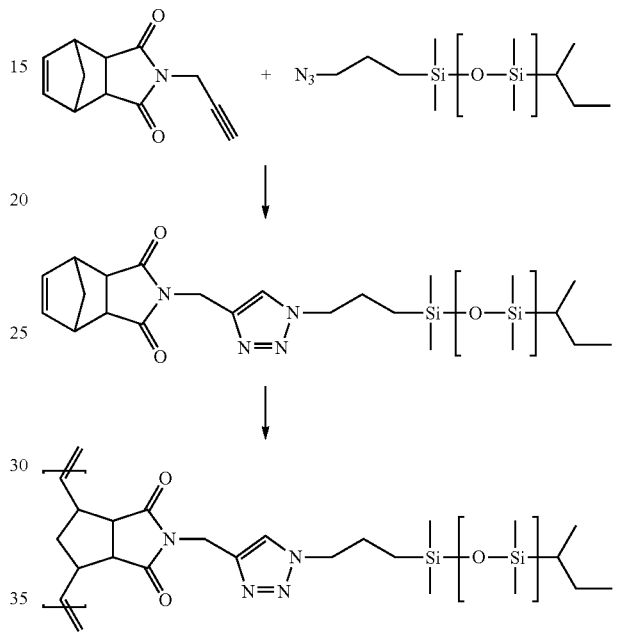

This example describes the synthesis of a bottlebrush polymer with polydimethylsiloxane (PDMS) arms and polynorbornene backbone, poly(norbornene-g-polydimethylsiloxane) (PDMS-BB). 2-(Prop-2-yn-1-yl)-3a,4,7,7a-tetrahydro-1H-4,7-methanoisoindole-1,3(2H)-dione was synthesized according to the procedure described in Macromolecules 2010, 43, 5611-5617. Azide terminated PDMS was synthesized according to literature (J Polym Sci Pol Chem 2014, 52, 3372-3382). A flame-dried 20 mL vial was charged with a stirrer bar, 2-(Prop-2-yn-1-yl)-3a,4,7,7a-tetrahydro-1H-4,7-methanoisoindole-1,3(2H)-dione (3.2 mg) and the azide terminated PDMS (0.174 g, 1 eq.). Degassed, anhydrous tetrahydrofuran (THF) (2 mL) was added into the flask, and 0.3 mL of a Cu stock solution (prepared from 1 mg Cu(I)Br and 5 µL PMDETA in 1 mL anhydrous THF). The reaction mixture was stirred and heated at 50° C. overnight. Cu was removed from the macromonomer solution by passing through basic alumina, and the polymer solution was then concentrated and precipitated in cold MeOH. Ring-opening metathesis polymerization (ROMP) was then conducted on the PDMS macromonomer (PDMS-MM) (ca. 100 mg) by dissolving it in a minimum amount of degassed, anhydrous solvent ([PDMS-MM]=60-100 mM) and injecting an appropriate amount of Grubbs 3$^{rd}$ generation catalyst, (1,3-Bis(2,4,6-trimethylphenyl)-2-imidazolidinylidene)dichloro(phenyl-methylene)(dipyridine)ruthenium (55 mM, [PDMS-MM]/[catalyst]=30, in anhydrous, deoxygenated solvent). The mixture was let stirred for overnight, precipitated in cold MeOH, filtered and dried for further analysis. GPC of the isolated polymer showed a multimodal trace that was deconvoluted into the following components: Peak 1, Mn=230 kg/mol, Mw/Mn=1.51; Peak 2: 78 kg/mol, Mw/Mn=1.46; Peak 3: 9 kg/mol, Mw/Mn=1.5 (corresponding to the PDMS-MM).

Comparative Example E

This example describes the formulation of a PS-b-PDMS linear block copolymers in solvent. Solutions of PS-b-PDMS-26, PS-b-PDMS-29, and PS-b-PDMS-31 were prepared by dissolving the polymers in 50/50 volume percent mixtures of propylene glycol monomethyl ether acetate (PGMEA) and n-butylacetate (NBA) at 1.2 wt % polymer to total mass. The solutions were filtered through a 0.2 µm PTFE filters.

Example 17

This example describes the formulation of PS-b-PDMS-26 with the bottlebrush with PDMS arms and polynorbornene backbone (PDMS-BB) in solvent. A solution of PDMS-BB was prepared by dissolving the polymer in a 50/50 volume percent mixture of propylene glycol monomethyl ether acetate (PGMEA) and n-butylacetate (NBA) at 1.2 wt % polymer to total mass. This solution was blended in different ratios with the solution of PS-b-PDMS-26 to give formulations with different ratios of PDMS-BB to PS-b-PDMS. The solutions were filtered through 0.2 µm PTFE filters. The different formulations are listed in Table 6.

TABLE 6

| Sample | PS-b-PDMS (vol %) | PDMS-BB (vol %) | Minority composition (vol %) |
|---|---|---|---|
| Comparative Example E | 100 | 0 | 26.2 |
| Example 17a | 97.5 | 2.5 | 28.0 |
| Example 17b | 95 | 5.0 | 29.9 |
| Example 17c | 92.5 | 7.5 | 31.7 |
| Example 17d | 90 | 10 | 33.6 |
| Example 17e | 80 | 20 | 41.0 |
| Example 17f | 70 | 30 | 48.3 |

Example 18

This example describes preparation of silicon wafer substrates to be coated with thin films of the formulations. The hydroxyl-terminated polystyrene bushes, PS—OH-1 and PS—OH-2, prepared according to Example 14 were individually dissolved in propylene glycol monomethyl ether acetate (PGMEA) to give 1.5 wt % solutions. The solutions were then blended in a 50/50 volume ratio to give a final brush formulation, which was filtered through a 0.2 µm Teflon filter. The surface of a silicon substrate having a native oxide layer was then modified by spin coating thereon this brush solution at 1,500 rpm for 30 seconds. The substrate was then placed on a hotplate set at 250° C. for 2 minutes to anneal the deposited brush layer. The substrate was then rinsed with PGMEA to wash away any unattached polymer by first soaking the substrate in PGMEA for 30 s and then spin drying at 3,000 rpm for 1 minute. The substrate was then baked on a hotplate set at 130° C. for 60 seconds.

Comparative Example F

This example describes thin film formation of linear PS-b-PDMS on the PS—OH brushed substrate. Thin films were prepared of the PS-b-PDMS formulations described in Comparative Example E by spin coating the solutions on PS-brushed silicon wafers prepared in Example 18. The formulations were spin-coated at 1,200 rpm onto a brushed substrate, baked on a hot plate at 130° C. for 1 minute, and annealed at 340° C. for 2 minutes under nitrogen. After thermal annealing, the films were subjected to two reactive ion etching steps using a PlasmaTherm 790i RIE, a 4 second $CF_4$ reactive ion etch (50 standard cubic centimeters (sccm), 100 watts) followed by a 8 second oxygen reactive ion etch (25 sccm, 180 watts) to remove the PS and oxidize the PDMS block. The samples were then imaged by scanning electron microscopy (Hitachi CG4000) at 40,000× and 400,000× magnification to characterize the morphology. The morphology for comparative examples D, E and F is shown in a photomicrograph in FIG. 11. The formulation with 26 vol % reveals the expected "fingerprint" structure from the oxidized PDMS cylinders. However, as the PDMS volume percent increase, the desired the fingerprint pattern largely disappears. These formulations at higher PDMS loadings are therefore not useful for forming nanoscale line patterns.

Example 19

Figure 12:
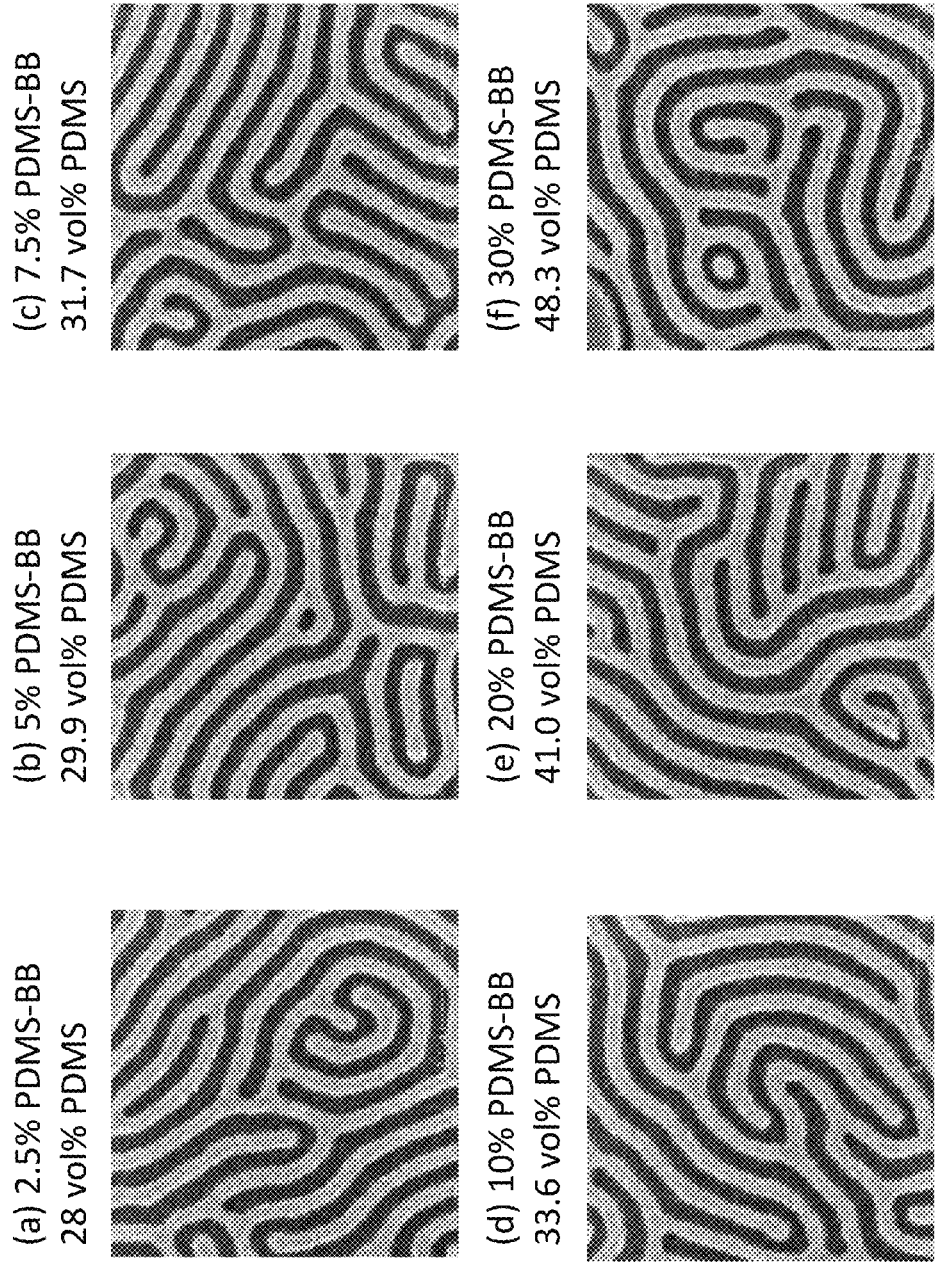
FIG. 12 is a micrograph that depicts the morphology of Examples 17, 18 and 19.

This example describes thin film formation of blends of linear PS-b-PDMS with PDMS bottlebrush polymers (PDMS-BB) on PS—OH brushed substrates. Thin films were prepared of the formulations described in Example 17 by spin coating the solutions on the PS-brushed silicon wafers prepared in Example 18. The formulations were independently spin-coated at 1,200 rpm onto brushed substrates, baked on a hot plate at 130° C. for 1 minute, and annealed at 340° C. for 2 minutes under nitrogen. After thermal annealing, the films were subjected to two reactive ion etching steps using a PlasmaTherm 790i RIE, a 4 second $CF_4$ reactive ion etch (50 standard cubic centimeters (sccm), 100 watts) followed by a 8 second oxygen reactive ion etch (25 sccm, 180 watts) to remove the PS and oxidize the PDMS block. The samples were then imaged by scanning electron microscopy (Hitachi CG4000) at 40,000× and 400,000× magnification to characterize the morphology. The morphologies are shown in the photomicrographs of FIG. 12. Unlike the thin films in Comparative Example F, the micrographs all reveal "fingerprint" structures from the oxidized PDMS cylinders, even in formulations with very high PDMS volume percentages.

What is claimed is:
1. A pattern forming method comprising:
   providing a substrate;
   disposing upon the substrate a composition comprising:
   a block copolymer comprising a first polymer and a second polymer; where the first polymer and the second polymer of the block copolymer are different from each other; and
   an additive polymer where the additive polymer comprises a bottlebrush polymer; where the bottlebrush polymer comprises a polymeric chain backbone and a grafted polymer that are bonded to each other; and where the polymer chain backbone is chemically similar to or identical with the first polymer, while the polymer graft is chemically similar to or identical with the second polymer; or where the polymer chain backbone and the polymer graft are chemically similar to or identical with either the first polymer or to the second polymer; and
   a solvent; and annealing the composition to facilitate domain separation between the first polymer and the second polymer of the block copolymer to form a morphology of periodic domains formed from the first polymer and the second polymer; where a longitudinal axis of the periodic domains are perpendicular to the substrate.

2. The method of claim 1, further comprising removing at least one domain of the block copolymer.

3. The method of claim 1, where the first polymer is a vinyl aromatic polymer obtained by a polymerization of units having a structure of formula (1):

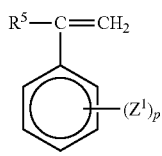

(1)

wherein $R^5$ is hydrogen, an alkyl, a haloalkyl or halogen; $Z^1$ is hydrogen, halogen, a hydroxyl, a haloalkyl or an alkyl; and p is from 1 to about 5.

4. The method of claim 1, where the second polymer is obtained from a polymerization of units having a structure represented by formula (2):

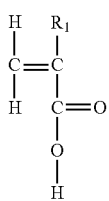

(2)

where $R_1$ is a hydrogen or an alkyl group having 1 to 10 carbon atoms; or where the second polymer has a structure derived from a monomer having a structure represented by the formula (3):

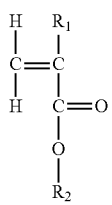

(3)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group.

5. The method of claim 1, where the bottlebrush copolymer is poly(norbornene-g-polymethylmethacrylate) or a poly(norbornene-g-polystyrene) or a poly(norbornene-g-polymethylmethacrylate-g-polystyrene).

6. The method of claim 1, where the block copolymer comprises polystyrene and polymethylmethacrylate and where the polystyrene is present in an amount of 20 to 35 mole percent based on a total number of moles of the block copolymer.

7. The method of claim 1, where the block copolymer is present in an amount of 80 to 99 wt %, based on a total weight of the block copolymer and the additive polymer and where the additive polymer is present in an amount of 1 to 20 wt %, based on a total weight of the block copolymer and the additive polymer.

* * * * *